(12) United States Patent
Toda et al.

(10) Patent No.: US 9,647,626 B2
(45) Date of Patent: May 9, 2017

(54) LC COMPOSITE COMPONENT

(71) Applicant: TDK CORPORATION, Tokyo (JP)

(72) Inventors: Shinichiro Toda, Tokyo (JP); Hajime Kuwajima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 103 days.

(21) Appl. No.: 14/700,718

(22) Filed: Apr. 30, 2015

(65) Prior Publication Data
US 2015/0351243 A1 Dec. 3, 2015

(30) Foreign Application Priority Data

May 28, 2014 (JP) .................................. 2014-110237
Feb. 26, 2015 (JP) .................................. 2015-037234

(51) Int. Cl.
*H03H 7/01* (2006.01)
*H01F 17/00* (2006.01)
(Continued)

(52) U.S. Cl.
CPC ....... *H03H 7/0115* (2013.01); *H01F 17/0013* (2013.01); *H03H 7/075* (2013.01); *H01F 27/292* (2013.01); *H01F 2017/0026* (2013.01); *H01F 2017/0066* (2013.01); *H03H 7/1708* (2013.01); *H03H 7/1758* (2013.01); *H03H 2001/0085* (2013.01)

(58) Field of Classification Search
CPC ......... H03H 2001/0085; H03H 7/0115; H03H 7/427; H03H 7/1708; H03H 7/1758
USPC ................................................. 333/175, 185
See application file for complete search history.

(56) References Cited

U.S. PATENT DOCUMENTS 5,051,712 A     9/1991   Naito et al.
5,714,239 A  *  2/1998   Maeda ................. H03H 7/0115
                                                    174/250
(Continued)

FOREIGN PATENT DOCUMENTS

JP    H07-135403 A    5/1995
JP    2002-052644 A   2/2002
JP    2008-027982 A   2/2008

OTHER PUBLICATIONS

Chen, Peilin et al., "A Single-layer Left-handed Material of Split-square LC Resonator Coupled with H-shaped structure", 2010 International Conference on Microwave and Millimeter Wave Technology (ICMMT 2010), May 2010, pp. 168-171.
(Continued)

*Primary Examiner* — Stephen E Jones
*Assistant Examiner* — Rakesh Patel
(74) *Attorney, Agent, or Firm* — Oliff PLC

(57) ABSTRACT

An LC composite component includes one or more inductors, one or more capacitors, a magnetic layer, and a substrate. The substrate has a first surface, and a second surface opposite to the first surface. The magnetic layer is disposed to face the first surface of the substrate. The one or more inductors are disposed between the first surface of the substrate and the magnetic layer. The substrate has a thickness greater than that of the magnetic layer in a direction perpendicular to the first surface of the substrate. The substrate has a complex permeability having a real part and an imaginary part that are respectively smaller than the real part and the imaginary part of the complex permeability of the magnetic layer.

5 Claims, 18 Drawing Sheets

(51) Int. Cl.
*H03H 7/075* (2006.01)
*H01F 27/29* (2006.01)
*H03H 1/00* (2006.01)

(56) References Cited

U.S. PATENT DOCUMENTS

| | | | |
|---|---|---|---|
| 6,071,430 A * | 6/2000 | Lebourgeois | H01F 1/344 |
| | | | 252/62.6 |
| 6,127,296 A * | 10/2000 | Uchikoba | C03C 3/091 |
| | | | 252/62.58 |
| 2007/0052062 A1 | 3/2007 | Ding et al. | |

OTHER PUBLICATIONS

Artillan, Philippe et al., "Integrated LC Filter on Silicon for DC-DC Converter Applications", IEEE Transactions on Power Electronics, Aug. 2011, vol. 26, No. 8, pp. 2319-2325.
Kowase, Isao et al. "A Planar Inductor Using Mn-Zn Ferrite/Polyimide Composite Thick Film for Low-Voltage and Large-Current DC-DC Converter". IEEE Transactions on Magnetics, vol. 41, No. 10., pp. 3991-3993, 2005.
Yamaguchi, K. et al. "Characteristics of a DC-DC Converter Using a Thin Film Microtransformer and a Microinductor". IEEE Translation Journal on Magnetics in Japan, vol. 9, No. 6., pp. 84-89, 1994.

* cited by examiner

LC COMPOSITE COMPONENT

BACKGROUND OF THE INVENTION

1. Field of the Invention

The present invention relates to an LC composite component, that is, an electronic component including an inductor and a capacitor.

2. Description of the Related Art

There are high demands for reductions in size, thickness and cost of wireless communication apparatuses such as cellular phones and wireless LAN communication apparatuses. Accordingly, electronic components for use in such wireless communication apparatuses are expected to meet the same demands. Furthermore, high electromagnetic shielding performance is demanded of such electronic components because they must be contained within a narrow space in a wireless communication apparatus.

An example of electronic components for use in wireless communication apparatuses is an LC composite component including an inductor and a capacitor. A known technique for downsizing an electronic component including an inductor is to surround the inductor with a material having magnetism, as disclosed in JP H07-135403A, JP 2002-052644A, and JP 2008-027982A, for example. This technique allows for a reduction in the size of the inductor needed to obtain a desired inductance, and consequently allows for downsizing of the electronic component.

JP H07-135403A discloses a high frequency filter in which a ground electrode is formed on one surface of a dielectric substrate, a plurality of pattern electrodes for forming microstrip resonators are formed on the other surface of the dielectric substrate, and a magnetic substrate is formed on the plurality of pattern electrodes.

JP 2002-052644A discloses an electronic component formed of a stack of constituent layers and conductor layers, each of the constituent layers being formed by coating a glass cloth with a resin that contains dielectric material powder and one of magnetic material powder, dielectric-coated metal powder and insulator-coated magnetic metal powder.

JP 2008-027982A discloses an LC composite component including a first magnetic substrate, a capacitor layer formed on the first magnetic substrate, an inductor layer formed on the capacitor layer, a second magnetic substrate formed on the inductor layer, and a magnetic core member. The capacitor layer includes lower electrodes formed on the first magnetic substrate, a thin dielectric film covering the top surfaces of the lower electrodes, and upper electrodes placed opposite to the lower electrodes with the thin dielectric film in between. The inductor layer includes a coil conductor formed on the top surface of an insulating layer. The magnetic core member passes through the inner diameter of the coil conductor and connects the first magnetic substrate and the second magnetic substrate.

A typical approach to enhancing the electromagnetic shielding performance of an electronic component is to provide two metal layers each having a large surface area on opposite sides of a constituent part of the electronic component, particularly an inductor. If this approach is applied to an LC composite component, however, any attempts to reduce the thickness of the LC composite component would lead to a reduced distance between the inductor and each metal layer, which would in turn lead to increased losses of the inductor due to eddy current losses, and eventually lead to degraded characteristics of the LC composite component in high frequency bands.

JP H07-135403 A teaches that the high frequency filter disclosed therein can achieve a greater reduction in size compared with a conventional high frequency filter which uses no magnetic substrate, and further, this high frequency filter is inexpensive because the magnetic substrate provides a shielding effect and thus eliminates the need for a shield electrode or the like.

In the high frequency filter disclosed in JP H07-135403A, however, all the plurality of pattern electrodes having inductance components and realizing a capacitor are placed on one plane. It is therefore difficult to achieve a further reduction in size. Furthermore, any attempts to achieve reduction in thickness of this high frequency filter would lead to a reduced distance from the pattern electrodes to the ground electrode having a large surface area. This would in turn lead to reduced inductance components of the pattern electrodes, thus making it difficult to obtain desired characteristic impedances of the pattern electrodes. It is thus difficult to achieve a further reduction in thickness of the high frequency filter disclosed in JP H07-135403A.

The electronic component disclosed in JP 2002-052644A uses a large amount of magnetic material powder, dielectric-coated metal powder or insulator-coated magnetic metal powder because every constituent layer of the electronic component contains one of such powders. This raises the cost of the electronic component. Further, in this electronic component, an inductor-forming conductor layer and a capacitor-forming conductor layer are disposed to overlap each other with a constituent layer in between when viewed in a direction perpendicular to the planes of the plurality of constituent layers. Thus, any attempts to reduce the thickness of this electronic component would lead to a reduced distance between the inductor-forming conductor layer and the capacitor-forming conductor layer, which would in turn lead to increased losses of the inductor due to eddy current losses, and eventually lead to degraded characteristics of the electronic component in high frequency bands.

The LC composite component disclosed in JP 2008-027982A has two magnetic substrates and thus uses a large amount of magnetic material, which raises the cost of the LC composite component. Further, in this LC composite component, the capacitor layer and the coil conductor are disposed to overlap each other with the insulating layer in between when viewed in a direction perpendicular to the planes of the magnetic substrates. Thus, any attempts to reduce the thickness of this LC composite component would lead to a reduced distance between the capacitor layer and the coil conductor, which would in turn lead to increased losses of the coil conductor due to eddy current losses, and eventually lead to degraded characteristics of the LC composite component in high frequency bands.

OBJECT AND SUMMARY OF THE INVENTION

It is an object of the present invention to provide an LC composite component that achieves reductions in size, thickness and cost, offers high electromagnetic shielding performance and is less susceptible to characteristic degradation resulting from inductor losses.

An LC composite component of the present invention includes one or more inductors, one or more capacitors, a magnetic layer having magnetism, and a substrate for supporting the one or more inductors, the one or more capacitors and the magnetic layer. The substrate has a first surface, and a second surface opposite to the first surface. The magnetic layer is disposed to face the first surface of the substrate. The one or more inductors are disposed between the first surface of the substrate and the magnetic layer. The substrate has a thickness greater than that of the magnetic layer in a direction perpendicular to the first surface of the substrate. The substrate has a complex permeability having a real part and an imaginary part that are respectively smaller than the real part and the imaginary part of the complex permeability of the magnetic layer.

In the LC composite component of the present invention, the thickness of the substrate may fall within the range of 1.1 to 3 times that of the magnetic layer.

In the LC composite component of the present invention, the one or more capacitors may be disposed between the first surface of the substrate and the magnetic layer such that the one or more capacitors do not overlap the one or more inductors when viewed in the direction perpendicular to the first surface of the substrate.

In the LC composite component of the present invention, the one or more capacitors may be disposed on a side of the substrate opposite from the one or more inductors.

The LC composite component of the present invention may further include one or more core sections having magnetism, the one or more core sections being disposed between the first surface of the substrate and the magnetic layer and connected to the magnetic layer. The one or more inductors may include one or more line-shaped conductor sections extending along the periphery or peripheries of the one or more core sections.

The provision of the magnetic layer in the LC composite component of the present invention allows for downsizing of the one or more inductors, and accordingly, downsizing of the LC composite component. In the LC composite component of the present invention, the magnetic layer is provided only on one side of the one or more inductors in the direction perpendicular to the first surface of the substrate. This allows for the use of smaller amounts of magnetic materials and consequently allows for a reduction in cost of the LC composite component.

Further, in the LC composite components of the present invention, the one or more inductors are disposed between the first surface of the substrate and the magnetic layer, and the substrate is greater than the magnetic layer in thickness in the direction perpendicular to the first surface of the substrate. This allows for enhancement of the electromagnetic shielding performance of the LC composite component. Further, the present invention eliminates the need for providing two metal layers of large surface area on opposite sides of the one or more inductors for the purpose of enhancing the electromagnetic shielding performance of the LC composite component. The present invention thus allows the LC composite component to be less susceptible to characteristic degradation resulting from inductor losses, and also allows for a reduction in thickness of the LC composite component.

As can be seen from the foregoing, the present invention makes it possible to provide an LC composite component that achieves reductions in size, thickness and cost, offers high electromagnetic shielding performance and is less susceptible to characteristic degradation resulting from inductor losses.

Other and further objects, features and advantages of the present invention will appear more fully from the following description.

DETAILED DESCRIPTION OF THE PREFERRED EMBODIMENTS

First Embodiment

Figure 1:
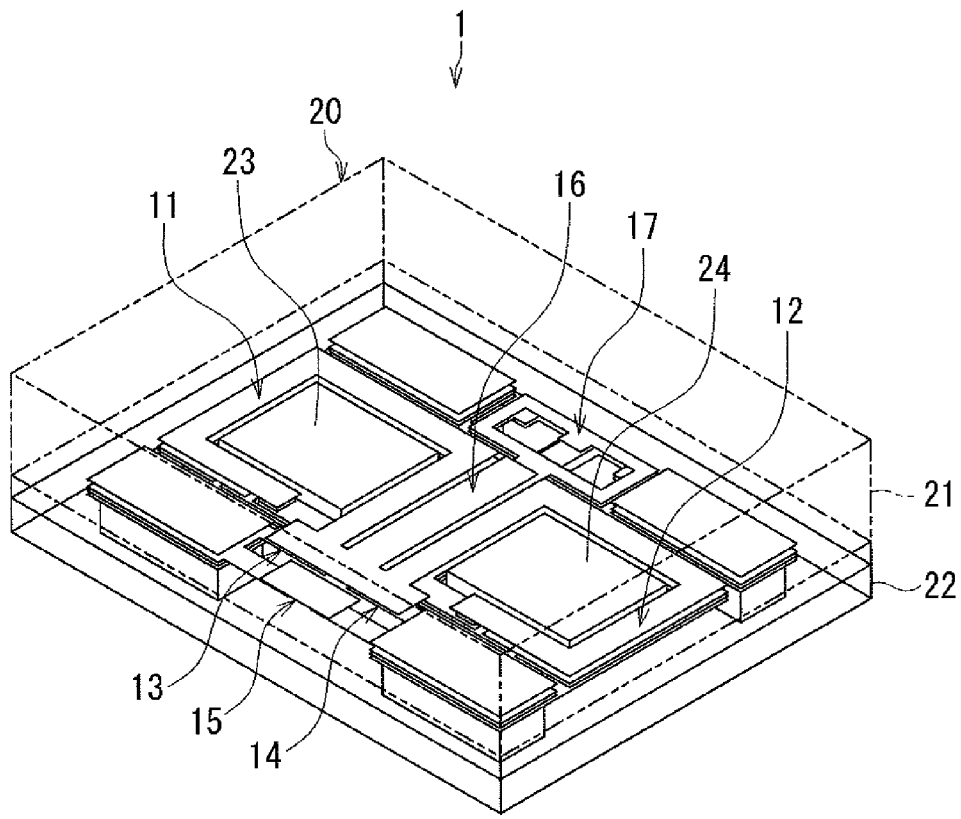
FIG. 1 is a perspective view showing the configuration of an LC composite component according to a first embodiment of the invention.
Figure 2:
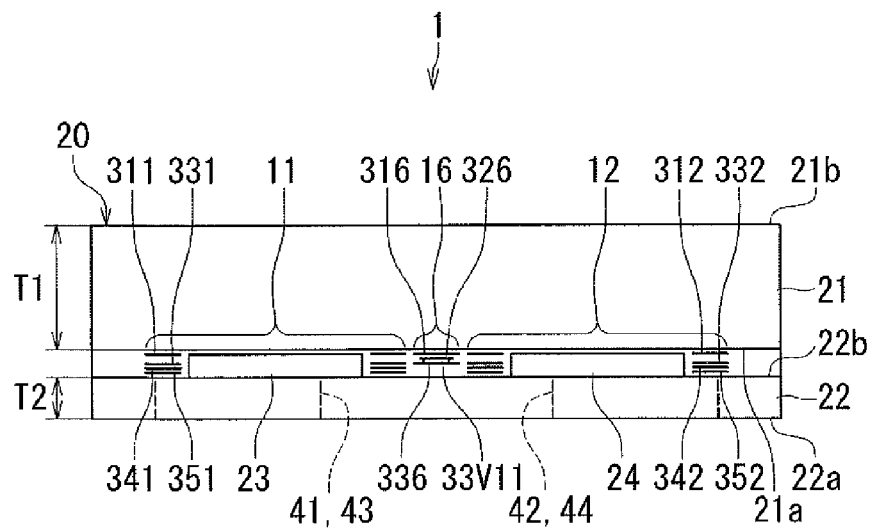
FIG. 2 is a cross-sectional view of the LC composite component according to the first embodiment of the invention.

Preferred embodiments of the present invention will now be described in detail with reference to the drawings. First, reference is made to FIGS. 1 and 2 to describe the general configuration of an LC composite component according to a first embodiment of the invention. FIG. 1 is a perspective view showing the configuration of the LC composite component according to the first embodiment. FIG. 2 is a cross-sectional view of the LC composite component according to the first embodiment.

The LC composite component 1 according to the first embodiment is an electronic component for use in wireless communication apparatuses such as cellular phones and wireless LAN communication apparatuses. The LC composite component 1 includes one or more inductors, one or more capacitors, a magnetic layer 22 having magnetism, and a substrate 21 for supporting the one or more inductors, the one or more capacitors and the magnetic layer 22. As shown in FIG. 2, the substrate 21 has a first surface 21a, and a second surface 21b opposite to the first surface 21a. The magnetic layer 22 is disposed to face the first surface 21a of the substrate 21. The magnetic layer 22 has a first surface 22a facing toward the same direction as the first surface 21a of the substrate 21, and a second surface 22b facing toward the same direction as the second surface 21b of the substrate 21. The second surface 22b of the magnetic layer 22 faces the first surface 21a of the substrate 21.

As shown in FIG. 2, let the symbol T1 denote the thickness of the substrate 21 in a direction perpendicular to the first surface 21a of the substrate 21, and the symbol T2 denote the thickness of the magnetic layer 22 in the same direction. The thickness T1 of the substrate 21 is greater than the thickness T2 of the magnetic layer 22. The thickness T1 of the substrate 21 preferably falls within the range of 1.1 to 3 times the thickness T2 of the magnetic layer 22, and more preferably within the range of 1.5 to 2 times the thickness T2 of the magnetic layer 22.

The substrate 21 has a complex permeability having a real part and an imaginary part that are respectively smaller than the real part and the imaginary part of the complex permeability of the magnetic layer 22. The substrate 21 thus has a complex relative permeability having a real part and an imaginary part that are respectively smaller than the real part and the imaginary part of the complex relative permeability of the magnetic layer 22. As far as such a condition for the complex relative permeability is satisfied, the substrate 21 may be either magnetic or nonmagnetic. As far as the aforementioned condition for the complex relative permeability is satisfied, the material of the substrate 21 can be selected from various materials such as resin, ceramic, glass, nonmagnetic ferrites, low-permeability ferrites having complex relative permeabilities whose real parts are larger than 1 and smaller than or equal to 2.5, and composites made of more than one of the above-listed materials.

The magnetic layer 22 may be formed only of magnetic material such as ferrites excluding nonmagnetic ferrites. Alternatively, the magnetic layer 22 may be formed of a material containing magnetic material particles dispersed in a nonmagnetic dielectric material such as resin, ceramic or glass.

The one or more inductors are disposed between the first surface 21a of the substrate 21 and the magnetic layer 22 (the second surface 22b). In the first embodiment, the one or more capacitors are disposed between the first surface 21a of the substrate 21 and the magnetic layer 22 (the second surface 22b) such that the one or more capacitors do not overlap the one or more inductors when viewed in the direction perpendicular to the first surface 21a. The LC composite component 1 further includes a stack of a plurality of dielectric layers provided between the first surface 21a of the substrate 21 and the magnetic layer 22 (the second surface 22b), each of the plurality of dielectric layers being formed of a dielectric material. The one or more inductors and the one or more capacitors are provided within the stack. The substrate 21, the magnetic layer 22 and the plurality of dielectric layers constitute a component body 20 for integrating the constituents of the LC composite component 1.

The component body 20 is rectangular solid-shaped, having a top surface, a bottom surface and four side surfaces. In the first embodiment, the top surface of the component body 20 is constituted by the second surface 21b of the substrate 21. The bottom surface of the component body 20 is constituted by the first surface 22a of the magnetic layer 22. The LC composite component 1 is mounted onto a mounting board (not illustrated) with the bottom surface of the component body 20 or the first surface 22a of the magnetic layer 22 toward the top surface of the mounting board, for example.

The LC composite component 1 further includes one or more core sections having magnetism, the one or more core sections being disposed between the first surface 21a of the substrate 21 and the magnetic layer 22 (the second surface 22b) and connected to the magnetic layer 22. The one or more core sections are embedded in the aforementioned stack of the plurality of dielectric layers. The one or more core sections have the function of making the inductance of the one or more inductors higher than that in the absence of the one or more core sections. In the first embodiment, the LC composite component 1 includes two prism-shaped core sections 23 and 24. The core sections 23 and 24 are arranged in this order from the left side in FIG. 2. The core sections 23 and 24 are formed of the same material as the magnetic layer 22, for example. The relationship of the core sections 23 and 24 with the one or more inductors will be described in detail later.

Figure 3:
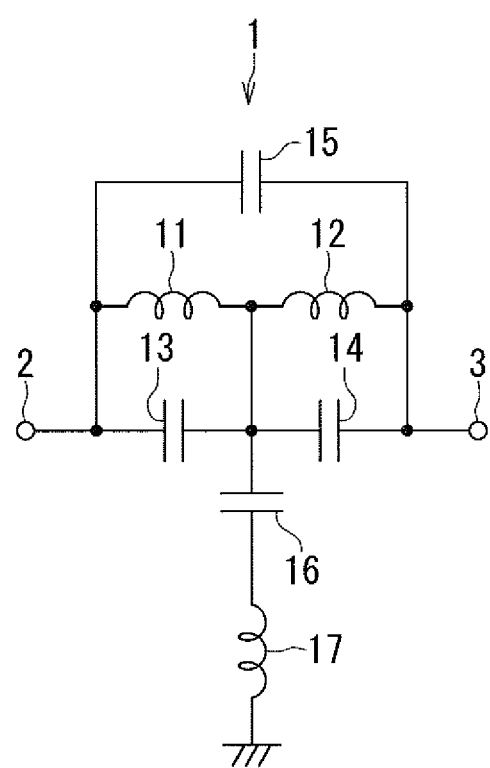
FIG. 3 is a circuit diagram showing the circuit configuration of the LC composite component according to the first embodiment of the invention.

Now, the circuit configuration of the LC composite component 1 according to the first embodiment will be described with reference to the circuit diagram of FIG. 3. In the first embodiment, the LC composite component 1 has the function of a low-pass filter. As shown in FIG. 3, the LC composite component 1 is provided with an input terminal 2 for receiving signals, an output terminal 3 for outputting signals, three inductors 11, 12 and 17, and four capacitors 13, 14, 15 and 16.

One end of the inductor 11, one end of the capacitor 13 and one end of the capacitor 15 are electrically connected to the input terminal 2. One end of the inductor 12, one end of the capacitor 14 and one end of the capacitor 16 are electrically connected to the other end of the inductor 11 and the other end of the capacitor 13. The other end of the inductor 12, the other end of the capacitor 14 and the other end of the capacitor 15 are electrically connected to the output terminal 3. One end of the inductor 17 is electrically connected to the other end of the capacitor 16. The other end of the inductor 17 is connected to the ground.

Reference is now made to FIGS. 4A to 5C to describe an example of specific configuration of the LC composite component 1 according to the first embodiment. In the first embodiment, the LC composite component 1 includes six dielectric layers 31, 32, 33, 34, 35 and 36 as the aforementioned plurality of dielectric layers. The dielectric layers 31 to 36 are disposed between the substrate 21 and the magnetic layer 22, and are arranged in the above-listed order from the first-surface-21a side of the substrate 21. Each of the dielectric layers 31 to 36 has a first surface facing toward the same direction as the first surface 21a of the substrate 21, and a second surface facing toward the same direction as the second surface 21b of the substrate 21. FIGS. 4A to 5C omit the illustration of the core sections 23 and 24.

Figure 4A:
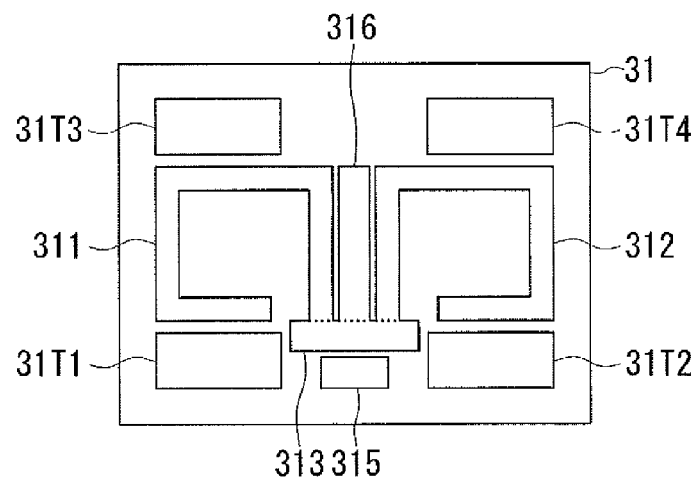
FIGS. 4A to 4C are explanatory diagrams for explaining the structure of the LC composite component shown in FIGS. 1 and 2.

FIG. 4A shows the first surface of the dielectric layer 31. Inductor-forming conductor sections 311 and 312, capacitor-forming conductor sections 313, 315 and 316, and terminal-forming conductor sections 31T1, 31T2, 31T3 and 31T4 are formed on the first surface of the dielectric layer 31. FIG. 4A illustrates the above-listed conductor sections as viewed from the second-surface side of the dielectric layer 31. The layout of the above-listed conductor sections in FIG. 4A is as follows. The conductor section 311 is located in the region to the left of the horizontal center. The conductor section 312 is located in the region to the right of the horizontal center. The conductor section 316 is located between the conductor section 311 and the conductor section 312. The conductor section 313 is located at a lower position relative to the conductor sections 311, 312 and 316. The conductor section 315 is located at a lower position relative to the conductor section 313. The conductor section 31T1 is located near the lower left corner. The conductor section 31T2 is located near the lower right corner. The conductor section 31T3 is located near the upper left corner. The conductor section 31T4 is located near the upper right corner.

The conductor section 313 is connected to one end of each of the conductor sections 311, 312 and 316. In FIG. 4A the boundary between any two conductor sections is indicated by a dotted line. Any figures similar to FIG. 4A, to be referred to for descriptions below, will also employ the same way of representation as in FIG. 4A. Each of the conductor sections 311 and 312 is a line-shaped conductor section extending from one end to the other end into a ring shape.

Figure 4B:
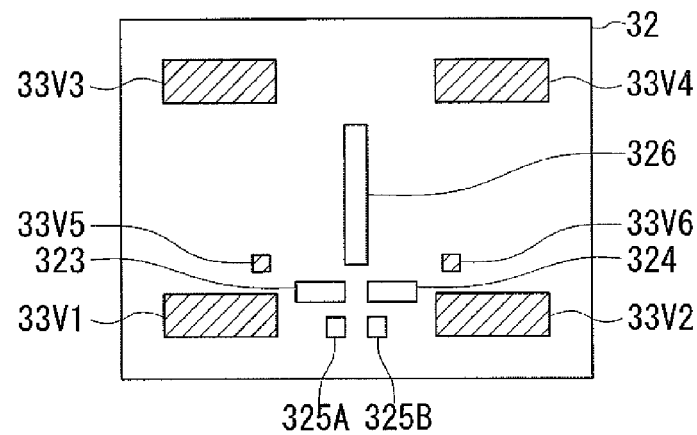

FIG. 4B shows the first surface of the dielectric layer 32. Capacitor-forming conductor sections 323, 324, 325A, 325B and 326 are formed on the first surface of the dielectric layer 32. FIG. 4B illustrates the above-listed conductor sections as viewed from the second-surface side of the dielectric layer 32. The layout of the above-listed conductor sections in FIG. 4B is as follows. The conductor section 326 is approximately centered horizontally. The conductor sections 323 and 324 are located at lower positions relative to the conductor section 326 and are arranged in this order from the left side. The conductor sections 325A and 325B are located at lower positions relative to the conductor sections 323 and 324 and are arranged in this order from the left side.

The conductor sections 323 and 324 are opposed to the conductor section 313 shown in FIG. 4A with the dielectric layer 32 interposed between the conductor section 313 and the conductor sections 323, 324. The capacitor 13 in FIG. 3 is constituted by the conductor sections 313 and 323 and a portion of the dielectric layer 32 that lies therebetween. The capacitor 14 in FIG. 3 is constituted by the conductor sections 313 and 324 and a portion of the dielectric layer 32 that lies therebetween. The conductor sections 325A and 325B are opposed to the conductor section 315 shown in FIG. 4A with the dielectric layer 32 interposed between the conductor section 315 and the conductor sections 325A, 325B. The capacitor 15 in FIG. 3 is constituted by the conductor section 315, the conductor sections 325A, 325B and a portion of the dielectric layer 32 that lies between the conductor section 315 and the conductor sections 325A, 325B. The conductor section 326 is opposed to the conductor section 316 shown in FIG. 4A with the dielectric layer 32 interposed therebetween. The capacitor 16 in FIG. 3 is constituted by the conductor sections 316 and 326 and a portion of the dielectric layer 32 that lies therebetween.

The LC composite component 1 includes conductor sections 33V1, 33V2, 33V3, 33V4, 33V5 and 33V6 penetrating the dielectric layers 32 and 33. The conductor sections 33V1 to 33V6 are hatched in FIG. 4B. Respective one ends of the conductor sections 33V1 to 33V4, 33V5 and 33V6 are connected to the conductor sections 31T1 to 31T4, 311 and 312 shown in FIG. 4A, respectively.

Figure 4C:
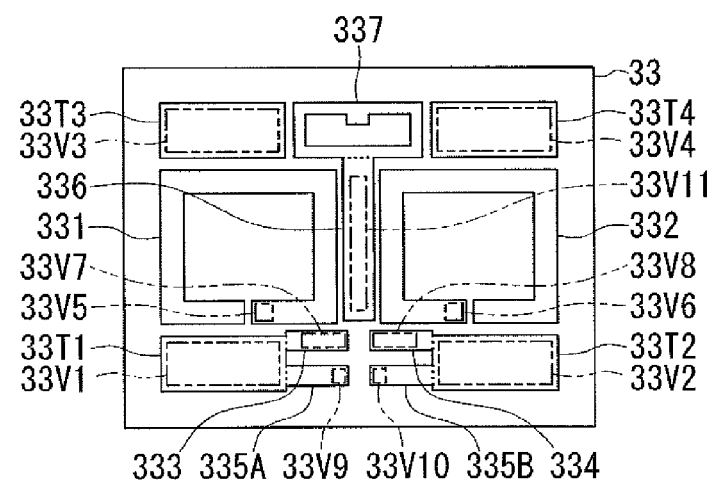

FIG. 4C shows the first surface of the dielectric layer 33. Inductor-forming conductor sections 331, 332 and 337, connection conductor sections 333, 334, 335A, 335B and 336, and terminal-forming conductor sections 33T1, 33T2, 33T3 and 33T4 are formed on the first surface of the dielectric layer 33. FIG. 4C illustrates the above-listed conductor sections as viewed from the second-surface side of the dielectric layer 33. The layout of the above-listed conductor sections in FIG. 4C is as follows. The conductor section 331 is located in the region to the left of the horizontal center. The conductor section 332 is located in the region to the right of the horizontal center. The conductor section 336 is located between the conductor section 331 and the conductor section 332. The conductor sections 333 and 334 are located at lower positions relative to the conductor sections 331, 332 and 336, and are arranged in this order from the left side. The conductor sections 335A and 335B are located at lower positions relative to the conductor sections 333 and 334, and are arranged in this order from the left side. The conductor section 337 is located at an upper position relative to the conductor sections 331, 332 and 336. The conductor section 33T1 is located near the lower left corner. The conductor section 33T2 is located near the lower right corner. The conductor section 33T3 is located near the upper left corner. The conductor section 33T4 is located near the upper right corner.

The conductor section 33T1 is connected to one end of each of the conductor sections 333 and 335A. The conductor section 33T2 is connected to one end of each of the conductor sections 334 and 335B. The conductor section 337 is connected to one end of the conductor section 336. Each of the conductor sections 331 and 332 is a line-shaped conductor section extending from one end to the other end into a ring shape.

The conductor sections 331, 332 and 33T1 to 33T4 are disposed to overlap the conductor sections 311, 312 and 31T1 to 31T4 shown in FIG. 4A, respectively, when viewed in the direction perpendicular to the first surface 21a of the substrate 21, i.e., the direction perpendicular to the first surface of the dielectric layer 33. The conductor sections 333, 334, 335A, 335B and 336 are disposed to overlap the conductor sections 323, 324, 325A, 325B and 326 shown in FIG. 4B, respectively, when viewed in the direction perpendicular to the first surface 21a of the substrate 21.

The LC composite component 1 includes conductor sections 33V7, 33V8, 33V9, 33V10 and 33V11 penetrating the dielectric layer 33. In FIG. 4C the conductor sections 33V1 to 33V11 are shown in chain double-dashed lines. The respective other ends of the conductor sections 33V1 to 33V4, 33V5 and 33V6 are connected to the conductor sections 33T1 to 33T4, 331 and 332, respectively. Respective one ends of the conductor sections 33V7, 33V8, 33V9, 33V10 and 33V11 are connected to the conductor sections 323, 324, 325A, 325B and 326 shown in FIG. 4B, respectively. The respective other ends of the conductor sections 33V7, 33V8, 33V9, 33V10 and 33V11 are connected to the conductor sections 333, 334, 335A, 335B and 336, respectively.

Figure 5A:
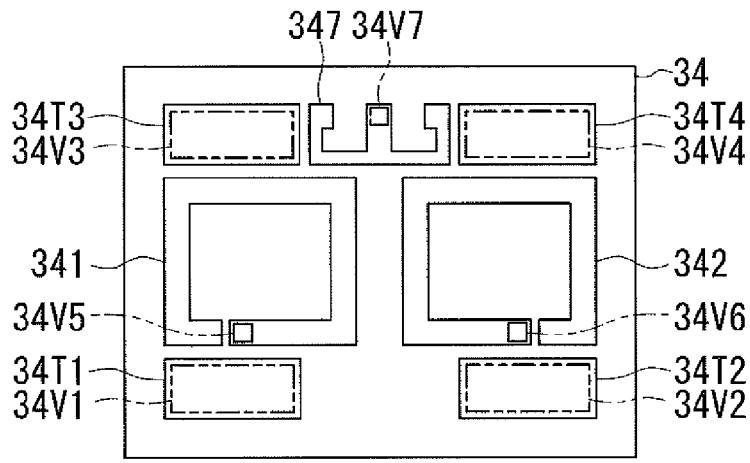
FIGS. 5A to 5C are explanatory diagrams for explaining the structure of the LC composite component shown in FIGS. 1 and 2.

FIG. 5A shows the first surface of the dielectric layer 34. Inductor-forming conductor sections 341, 342 and 347 and terminal-forming conductor sections 34T1, 34T2, 34T3 and 34T4 are formed on the first surface of the dielectric layer 34. FIG. 5A illustrates the above-listed conductor sections as viewed from the second-surface side of the dielectric layer 34. The layout of the above-listed conductor sections in FIG. 5A is as follows. The conductor section 341 is located in the region to the left of the horizontal center. The conductor section 342 is located in the region to the right of the horizontal center. The conductor section 347 is located at an upper position relative to the conductor sections 341 and 342. The conductor section 34T1 is located near the lower left corner. The conductor section 34T2 is located near the lower right corner. The conductor section 34T3 is located near the upper left corner. The conductor section 34T4 is located near the upper right corner.

Each of the conductor sections 341 and 342 is a line-shaped conductor section extending from one end to the other end into a ring shape. The conductor sections 341, 342, 347 and 34T1 to 34T4 are disposed to overlap the conductor sections 331, 332, 337 and 33T1 to 33T4 shown in FIG. 4C, respectively, when viewed in the direction perpendicular to the first surface 21a of the substrate 21, i.e., the direction perpendicular to the first surface of the dielectric layer 34.

The LC composite component 1 includes conductor sections 34V1, 34V2, 34V3, 34V4, 34V5, 34V6 and 34V7 penetrating the dielectric layer 34. In FIG. 5A the conductor sections 34V1 to 34V7 are shown in chain double-dashed lines. Respective one ends of the conductor sections 34V1 to 34V4, 34V5, 34V6 and 34V7 are connected to the conductor sections 33T1 to 33T4, 331, 332 and 337 shown in FIG. 4C, respectively. The respective other ends of the conductor sections 34V1 to 34V4, 34V5, 34V6 and 34V7 are connected to the conductor sections 34T1 to 34T4, 341, 342 and 347, respectively.

Figure 5B:
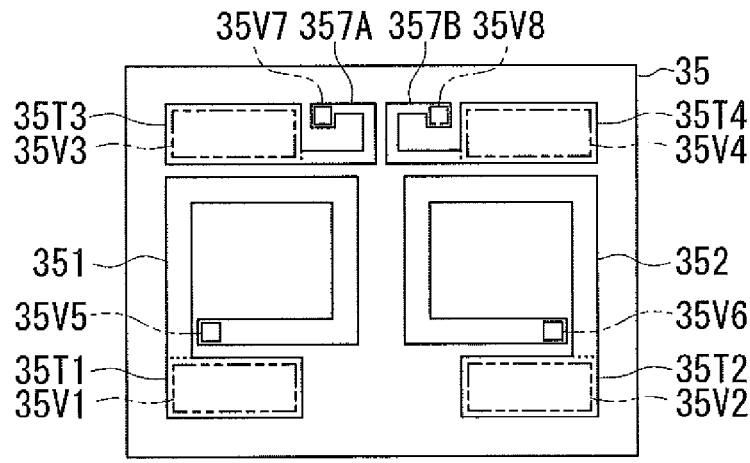

FIG. 5B shows the first surface of the dielectric layer 35. Inductor-forming conductor sections 351, 352, 357A and 357B and terminal-forming conductor sections 35T1, 35T2, 35T3 and 35T4 are formed on the first surface of the dielectric layer 35. FIG. 5B illustrates the above-listed conductor sections as viewed from the second-surface side of the dielectric layer 35. The layout of the above-listed conductor sections in FIG. 5B is as follows. The conductor section 351 is located in the region to the left of the horizontal center. The conductor section 352 is located in the region to the right of the horizontal center. The conductor sections 357A and 357B are located at upper positions relative to the conductor sections 351 and 352, and are arranged in this order from the left side. The conductor section 35T1 is located near the lower left corner. The conductor section 35T2 is located near the lower right corner. The conductor section 35T3 is located near the upper left corner. The conductor section 35T4 is located near the upper right corner.

The conductor sections 35T1, 35T2, 35T3 and 35T4 are connected to respective one ends of the conductor sections 351, 352, 357A and 357B, respectively. Each of the conductor sections 351 and 352 is a line-shaped conductor section extending from one end to the other end into a ring shape.

The conductor sections 351, 352 and 35T1 to 35T4 are disposed to overlap the conductor sections 341, 342 and 34T1 to 34T4 shown in FIG. 5A, respectively, when viewed in the direction perpendicular to the first surface 21a of the substrate 21, i.e., the direction perpendicular to the first surface of the dielectric layer 35. The conductor sections 357A and 357B are disposed to overlap the conductor section 347 shown in FIG. 5A when viewed in the direction perpendicular to the first surface 21a of the substrate 21.

The LC composite component 1 includes conductor sections 35V1, 35V2, 35V3, 35V4, 35V5, 35V6, 35V7 and 35V8 penetrating the dielectric layer 35. In FIG. 5B the conductor sections 35V1 to 35V8 are shown in chain double-dashed lines. Respective one ends of the conductor sections 35V1 to 35V4, 35V5 and 35V6 are connected to the conductor sections 34T1 to 34T4, 341 and 342 shown in FIG. 5A, respectively. Respective one ends of the conductor sections 35V7 and 35V8 are connected to the conductor section 347 shown in FIG. 5A. The respective other ends of the conductor sections 35V1 to 35V4, 35V5, 35V6, 35V7 and 35V8 are connected to the conductor sections 35T1 to 35T4, 351, 352, 357A and 357B, respectively.

Figure 5C:
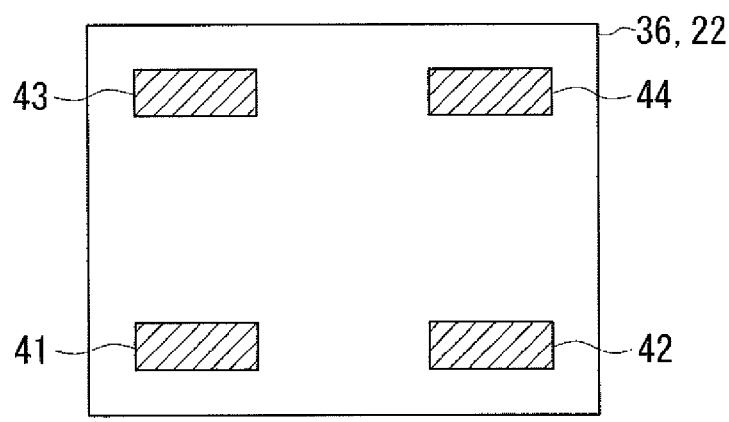

FIG. 5C shows the magnetic layer 22, the dielectric layer 36, and elements penetrating the magnetic layer 22 and the dielectric layer 36. The LC composite component 1 includes terminal-forming conductor sections 41, 42, 43 and 44 penetrating the magnetic layer 22 and the dielectric layer 36. The terminal-forming conductor sections 41 to 44 are hatched in FIG. 5C. Respective one ends of the terminal-forming conductor sections 41 to 44 are connected to the conductor sections 35T1 to 35T4 shown in FIG. 5B, respectively.

The specific configuration of the LC composite component 1 will now be described in more detail with reference also to FIGS. 2 and 3. The input terminal 2 in FIG. 3 is constituted by the other end of the terminal-forming conductor section 41. The output terminal 3 in FIG. 3 is constituted by the other end of the terminal-forming conductor section 42. The other end of each of the terminal-forming conductor sections 43 and 44 constitutes a ground terminal connected to the ground.

The inductor 11 in FIG. 3 is constituted by the inductor-forming conductor sections 311, 331, 341 and 351 and the conductor sections 33V5, 34V5 and 35V5. As shown in FIG. 2, the core section 23 penetrates the dielectric layers 32 to 36 and lies inside the inner peripheries of the conductor sections 311, 331, 341 and 351. Each of the conductor sections 311, 331, 341 and 351 is a line-shaped conductor section extending along the periphery of the core section 23.

The inductor 12 in FIG. 3 is constituted by the inductor-forming conductor sections 312, 332, 342 and 352 and the conductor sections 33V6, 34V6 and 35V6. As shown in FIG. 2, the core section 24 penetrates the dielectric layers 32 to 36 and lies inside the inner peripheries of the conductor sections 312, 332, 342 and 352. Each of the conductor sections 312, 332, 342 and 352 is a line-shaped conductor section extending along the periphery of the core section 24.

The inductor 17 in FIG. 3 is constituted by the inductor-forming conductor sections 337, 347, 357A and 357B and the conductor sections 34V7, 35V7 and 35V8.

As described previously, the capacitor-forming conductor sections 313, 315, 316, 323, 324, 325A, 325B and 326 and the portions of the dielectric layer 32 mentioned previously constitute the capacitors 13 to 16. As shown in FIGS. 4A to 5C, all the conductor sections 313, 315, 316, 323, 324, 325A, 325B and 326 are disposed such that they do not overlap the inductor-forming conductor sections 311, 312, 331, 332, 337, 341, 342, 347, 351, 352, 357A and 357B and the conductor sections 33V5, 33V6, 34V5 to 34V7 and 35V5 to 35V8 when viewed in the direction perpendicular to the first surface 21a of the substrate 21. It can thus be said that the capacitors 13 to 16 are disposed such that they do not to overlap the inductors 11, 12 and 17 when viewed in the direction perpendicular to the first surface 21a of the substrate 21.

Figure 6:
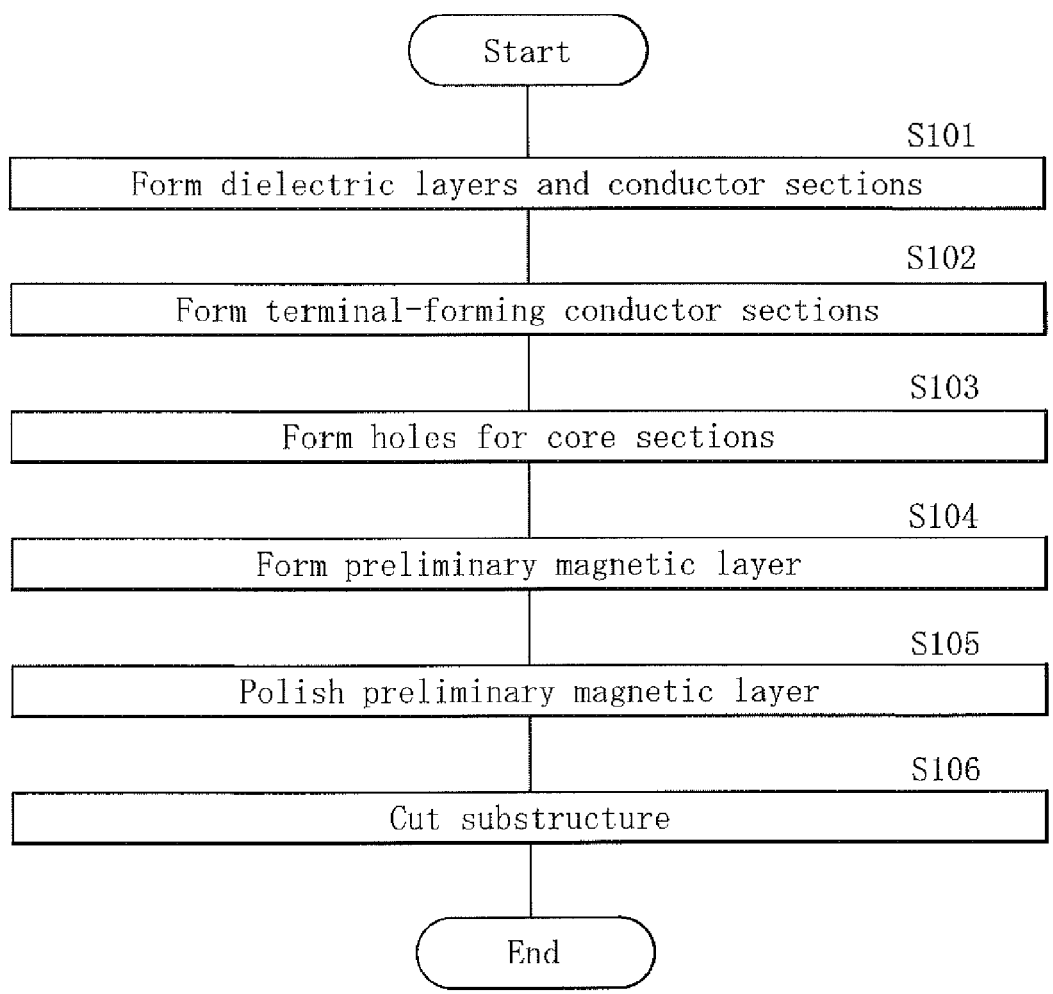
FIG. 6 is a flow chart showing an example of a method of manufacturing the LC composite component according to the first embodiment of the invention.

An example of a manufacturing method for the LC composite component 1 according to the first embodiment will now be described with reference to FIGS. 4A to 5C and FIG. 6. FIG. 6 shows a flow chart of the example of the manufacturing method for the LC composite component 1 according to the first embodiment. The manufacturing method of this example fabricates a substructure including a plurality of component bodies 20 of LC composite components 1 arranged in rows, and then cuts the substructure to separate the plurality of component bodies 20 from one another, thereby producing a plurality of LC composite components 1. The substructure is fabricated by forming respective constituents of the plurality of LC composite components 1, other than the substrates 21, on a wafer including portions to become the substrates 21 of the plurality of LC composite components 1.

The manufacturing method for the LC composite component 1 of the above example will be described in more detail below with attention focused on a single LC composite component 1. For the sake of convenience, in the following description, the portion of the wafer to become the substrate 21 will be referred to as the substrate 21. The manufacturing method of this example starts with forming the dielectric layers and the conductor sections on the substrate 21 by using thin-film forming techniques (Step S101 of FIG. 6). More specifically, first, the dielectric layer 31 is formed on the first surface 21a of the substrate 21. Then, the conductor sections shown in FIG. 4A are formed on the dielectric layer 31. One possible method for forming the conductor sections is to form unpatterned conductor layers first and then etching and thereby patterning the conductor layers by using a mask. Another possible method for forming the conductor sections is to form patterned conductor layers by using a mask. The conductor layers can be formed by using various thin-film forming techniques such as sputtering and plating. The other conductor sections to be described below can be formed in the same manner as above.

Next, the dielectric layer 32 is formed by sputtering, for example. Then, the capacitor-forming conductor sections 323, 324, 325A, 325B and 326 shown in FIG. 4B are formed on the dielectric layer 32. The dielectric layer 33 is then formed. Subsequently, six holes for the conductor sections 33V1 to 33V6 are formed in the dielectric layers 32 and 33, and five holes for the conductor sections 33V7 to 33V11 are formed in the dielectric layer 33. Then, the conductor sections shown in FIG. 4C are formed.

Next, the dielectric layer 34 is formed. Seven holes for the conductor sections 34V1 to 34V7 are then formed in the dielectric layer 34. Next, the conductor sections shown in FIG. 5A are formed. The dielectric layer 35 is then formed. Subsequently, eight holes for the conductor sections 35V1 to 35V8 are formed in the dielectric layer 35. The conductor sections shown in FIG. 5B are then formed. Next, the dielectric layer 36 is formed.

Four holes for the terminal-forming conductor sections 41 to 44 are then formed in the dielectric layer 36. Next, the terminal-forming conductor sections 41 to 44 shown in FIG. 5C are formed by plating, for example (Step S102 of FIG. 6). The terminal-forming conductor sections 41 to 44 are formed to be greater in thickness than the dielectric layer 36.

Next, two holes for the core sections 23 and 24 are formed in the dielectric layers 32 to 36 (Step S103 of FIG. 6). Then, a preliminary magnetic layer, which will later become the magnetic layer 22 and the core sections 23 and 24, is formed to fill the two holes and cover the terminal-forming conductor sections 41 to 44 (Step S104 of FIG. 6). The preliminary magnetic layer is then polished until the terminal-forming conductor sections 41 to 44 are exposed (Step S105 of FIG. 6). As a result of this polishing, two portions of the preliminary magnetic layer remaining in the two holes for the core sections 23 and 24 become the core sections 23 and 24, and the remainder of the preliminary magnetic layer becomes the magnetic layer 22. The substructure is completed by the formation of the magnetic layer 22 and the core sections 23 and 24. Then, the substructure is cut to obtain a plurality of component bodies 20 (Step S107 of FIG. 6).

The manufacturing method of the above example needs a substrate 21 of relatively large thickness. This is advantageous in achieving the feature of the LC composite component 1 that the thickness T1 of the substrate 21 is greater than the thickness T2 of the magnetic layer 22.

The LC composite component 1 according to the first embodiment can be manufactured by other methods than the above-described example. For example, among the constituents of the LC composite component 1, at least the dielectric layers and conductor sections between the substrate 21 and the magnetic layer 22 may be formed by a low-temperature co-firing method.

The operation and effects of the LC composite component 1 according to the first embodiment will now be described. The LC composite component 1 according to the first embodiment is provided with the magnetic layer 22 near the three inductors 11, 12 and 17 as shown in FIG. 1. This allows for a reduction in the size of the inductors 11, 12 and 17 needed to obtain desired inductances. The first embodiment thus allows for downsizing of the inductors 11, 12 and 17, and accordingly, downsizing of the LC composite component 1.

Further, according to the first embodiment, the inductors 11, 12 and 17 can be downsized by reducing the lengths of the inductor-forming conductor sections constituting the inductors 11, 12 and 17. This allows for reductions in the resistance values of the inductors 11, 12 and 17, and consequently allows for reductions in the conductor losses of the inductors 11, 12 and 17.

Further, in the first embodiment, the magnetic layer 22 is provided only on one side of the inductors 11, 12, 17 in the direction perpendicular to the first surface 21a of the substrate 21. This allows for the use of smaller amounts of magnetic materials and consequently allows for a reduction in cost of the LC composite component 1 when compared with the case where magnetic layers are provided on opposite sides of the inductors 11, 12, 17 in the aforementioned direction. From this point of view, it is preferable that the substrate 21 be nonmagnetic, i.e., that the substrate 21 have a complex relative permeability whose real part is 1 or approximately 1. More specifically, the real part of the complex relative permeability of the substrate 21 preferably falls within the range of 1 to 2.5. It should be noted that the real part of complex permeability is a product of the real part of complex relative permeability and the permeability of a vacuum ($4\pi \times 10^{-7}$ [Hm]).

In the first embodiment, the inductors 11, 12 and 17 are interposed between the substrate 21 and the magnetic layer 22. Now, let us consider a first space located on the magnetic-layer-22 side when viewed from the inductors 11, 12 and 17, and a second space located on the substrate-21 side when viewed from the inductors 11, 12 and 17. In the first space, the magnetic layer 22 provides an electromagnetic shielding effect for the inductors 11, 12 and 17. In the second space, the substrate 21 thicker than the magnetic layer 22 is present while the magnetic layer 22 is not present. In the second space, the substrate 11 serves to keep any elements having an electromagnetic effect on the inductors 11, 12 and 17 away from the inductors 11, 12 and 17. Consequently, in the second space, the substrate 21 provides an electromagnetic shielding effect for the inductors 11, 12 and 17. The first embodiment thus makes it possible to enhance the electromagnetic shielding performance of the LC composite component 1.

In the first embodiment, the imaginary part of the complex permeability of the substrate 21 is smaller than the imaginary part of the complex permeability of the magnetic layer 22. This makes it possible to suppress increases in magnetic losses of the inductors 11, 12 and 17 resulting from an increase in the thickness T1 of the substrate 21 located near the inductors 11, 12 and 17. From this point of view, the imaginary part of the complex relative permeability of the substrate 21 is preferably as small as possible. More specifically, the imaginary part of the complex relative permeability of the substrate 21 preferably falls within the range of 0 to 0.025. It should be noted that the imaginary part of complex permeability is a product of the imaginary part of complex relative permeability and the permeability of a vacuum.

It is preferable that the real part of the complex relative permeability of the magnetic layer 22 be relatively large so that the aforementioned effect of downsizing the inductors 11, 12 and 17 can be markedly exerted by the magnetic layer 22. More specifically, the real part of the complex relative permeability of the magnetic layer 22 preferably falls within the range of 1.1 to 5.0.

A first simulation was performed to determine the relationship between the ratio of the real part of the complex relative permeability of the magnetic layer 22 to the real part of the complex relative permeability of the substrate 21 and a length of the inductor 11 that yields a desired inductance. The results of the first simulation will now be described. The ratio of the real part of the complex relative permeability of the magnetic layer 22 to the real part of the complex relative permeability of the substrate 21 is herein referred to as the permeability ratio. The ratio of a length of the inductor 11 that yields a desired inductance when the permeability ratio is of an arbitrary value to a length of the inductor 11 that yields the desired inductance when the permeability ratio is 1 is herein referred to as the inductor length ratio. In the first simulation, the real part of the complex relative permeability of the substrate 21 was set to 1. Hereinafter, the length of the inductor 11 will be called the inductor length. In the first simulation, the inductor 11 was assumed as a band-shaped inductor extending in one direction. The first simulation assumed 2725 µm as the inductor length that yields a desired inductance when the permeability ratio is 1. The results of the first simulation are shown in Table 1 and FIG. 7.

TABLE 1

| Permeability ratio | Inductor length ratio | Inductor length (µm) |
| --- | --- | --- |
| 1.0 | 1.0 | 2725 |
| 1.1 | 0.96 | 2617 |
| 1.5 | 0.87 | 2372 |
| 2.0 | 0.79 | 2156 |
| 2.5 | 0.74 | 2010 |
| 3.0 | 0.70 | 1898 |
| 3.5 | 0.67 | 1813 |
| 4.0 | 0.64 | 1742 |
| 4.5 | 0.62 | 1685 |
| 5.0 | 0.60 | 1637 |
| 5.5 | 0.59 | 1597 |
| 6.0 | 0.57 | 1563 |

Figure 7:
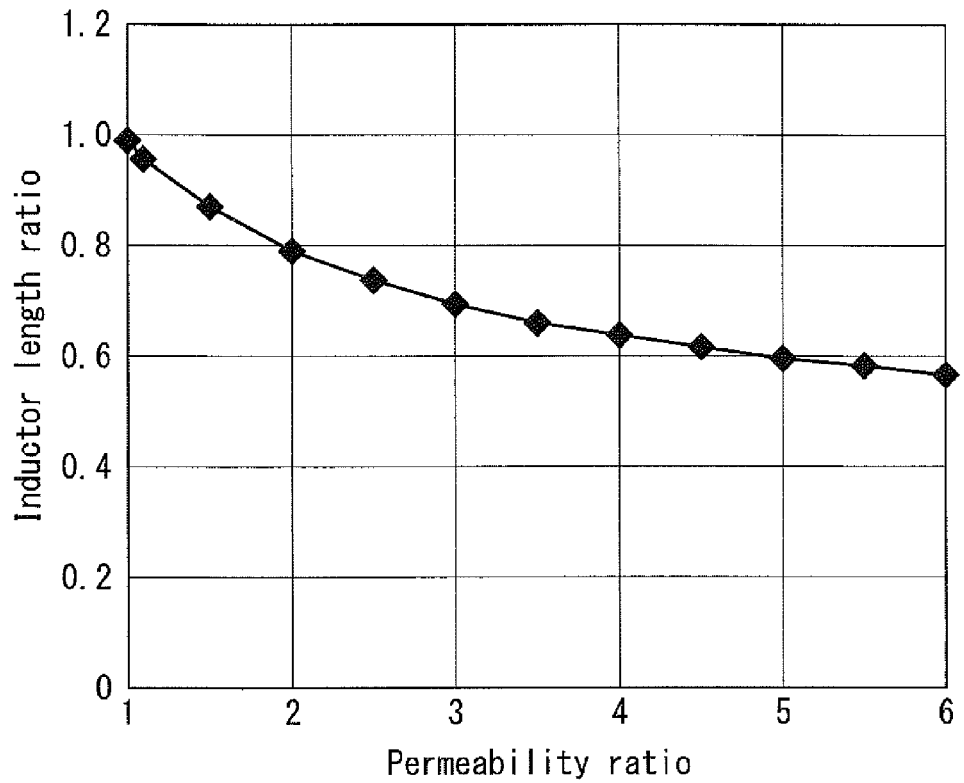
FIG. 7 is a characteristic diagram showing the results of a first simulation.

Table 1 and FIG. 7 show that when the permeability ratio is 1.1 or more, the inductor length ratio is 0.96 or less, which indicates a significant reduction effect on the inductor length. Table 1 and FIG. 7 also show that when the permeability ratio is 1.5 or more, the inductor length ratio is 0.87 or less, which indicates a remarkable exertion of the aforementioned reduction effect. It is expected that a coil-shaped inductor 11 would produce a higher effect of reducing the inductor length than a band-shaped inductor extending in one direction. It can thus be said that the results of the first simulation indicate a minimum magnitude of the effect of reducing the inductor length obtainable with an actual LC composite component 1.

In consideration of the results of the first simulation, the real part of the complex relative permeability of the magnetic layer 22 is preferably not smaller than 1.1 times the real part of the complex relative permeability of the substrate 21 so that the magnetic layer 22 can exert the aforementioned effect of downsizing the inductors 11, 12 and 17 significantly better than in a case where the real part of the complex relative permeability of the magnetic layer 22 is equal to the real part of the complex relative permeability of the substrate 21. For remarkable exertion of the aforementioned effect, it is more preferable that the real part of the complex relative permeability of the magnetic layer 22 be not smaller than 1.5 times the real part of the complex relative permeability of the substrate 21.

The imaginary part of the complex relative permeability of the magnetic layer 22 is preferably larger from the viewpoint of allowing the magnetic layer 22 to markedly exert the electromagnetic shielding effect for the inductors 11, 12 and 17; however, if the imaginary part is excessively large, magnetic losses of the inductors 11, 12 and 17 may increase. In consideration of such circumstances, the imaginary part of the complex relative permeability of the magnetic layer 22 preferably falls within the range of 0.0011 to 0.05.

In order for the substrate 21 to provide sufficient electromagnetic shielding effect, it is necessary to make the thickness T1 of the substrate 21 definitely larger than the thickness T2 of the magnetic layer 22. On the other hand, an excessively large thickness T1 of the substrate 21 would lead to an excessively large thickness of the LC composite component 1, contrary to the demands for reductions in size and thickness of the LC composite component 1. In consideration of these circumstances, the first embodiment defines that the thickness T1 of the substrate 21 falls within the range of 1.1 to 3 times the thickness T2 of the magnetic layer 22, and preferably within the range of 1.5 to 2 times the thickness T2.

In order for the substrate 21 to provide an electromagnetic shielding effect equivalent to or higher than that provided by the magnetic layer 22 under the condition that the real part of the complex relative permeability of the magnetic layer 22 is not smaller than 1.1 times that of the complex relative permeability of the substrate 21, the thickness T1 of the substrate 21 needs to be not smaller than 1.1 times the thickness T2 of the magnetic layer 22. In order for the substrate 21 to provide an electromagnetic shielding effect equivalent to or higher than that provided by the magnetic layer 22 under the condition that the real part of the complex relative permeability of the magnetic layer 22 is not smaller than 1.5 times that of the complex relative permeability of the substrate 21, the thickness T1 of the substrate 21 needs to be not smaller than 1.5 times the thickness T2 of the magnetic layer 22.

A typical approach to enhancing the electromagnetic shielding performance of an electronic component is to provide two metal layers each having a large surface area on opposite sides of a constituent part of the electronic component, particularly an inductor. If this approach is applied to an LC composite component, however, any attempts to reduce the thickness of the LC composite component would lead to a reduced distance between the inductor and each metal layer, which would in turn lead to increased losses of the inductor due to eddy current losses, and eventually lead to degraded characteristics of the LC composite component in high frequency bands. In the first embodiment, in contrast, since the substrate 21 and the magnetic layer 22 provide electromagnetic shielding effects as described above, there is no need to provide two metal layers of large surface area on opposite sides of the inductors 11, 12, 17. Consequently, the first embodiment allows the LC composite component 1 to be less susceptible to characteristic degradation resulting from losses of the inductors 11, 12 and 17, and also allows for a reduction in thickness of the LC composite component 1.

If the capacitor-forming conductor sections constituting the capacitors 13 to 16 are disposed to overlap the inductor-forming conductor sections constituting the inductors 11, 12 and 17 when viewed in the direction perpendicular to the first surface 21a of the substrate 21, a reduction in thickness of the LC composite component 1 would lead to reduced distances from the capacitor-forming conductor sections to the inductor-forming conductor sections, which would in turn lead to increased losses of the inductors 11, 12 and 17 due to eddy current losses attributable to the capacitor-forming conductor sections, and eventually lead to degraded characteristics of the LC composite component 1 in high frequency bands. In the first embodiment, in contrast, the capacitors 13 to 16 are disposed between the first surface 21a of the substrate 21 and the magnetic layer 22 such that the capacitors 13 to 16 do not overlap the inductors 11, 12 and 17 when viewed in the direction perpendicular to the first surface 21a of the substrate 21. According to the first embodiment, such a configuration also allows the LC composite component 1 to be less susceptible to characteristic degradation resulting from losses of the inductors 11, 12 and 17, and also allows for a reduction in thickness of the LC composite component 1.

The LC composite component 1 according to the first embodiment further includes the two core sections 23 and 24. The inductor 11 includes the inductor-forming conductor sections 311, 331, 341 and 351 each of which is a line-shaped conductor section extending along the periphery of the core section 23. The inductor 12 includes the inductor-forming conductor sections 312, 332, 342 and 352 each of which is a line-shaped conductor section extending along the periphery of the core section 24. According to the first embodiment, such a configuration also allows for downsizing of the inductors 11 and 12, and consequently allows for downsizing of the LC composite component 1. Further, where the inductors 11 and 12 are downsized by reducing the lengths of the conductor sections 311, 312, 331, 332, 341, 342, 351 and 352, resistance values of the inductors 11 and 12 are reduced. This makes it possible to reduce the conductor losses of the inductors 11 and 12.

Consequently, the first embodiment provides an LC composite component 1 that achieves reductions in size, thickness and cost, offers high electromagnetic shielding performance and is less susceptible to characteristic degradation resulting from losses of inductors.

Now, the electromagnetic shielding effect of the magnetic layer 22 will be described with reference to the results of a second simulation. The second simulation used first and second example models and a comparative example model described below. Both the first and second example models use the LC composite component 1 according to the first embodiment. The first example model is a model of the LC composite component 1 alone. The second example model is a model with two metal shield plates provided near the LC composite component 1 such that one of the two metal shield plates faces the top surface of the component body 20 (the second surface 21b of the substrate 21) of the LC composite component 1 and the other faces the bottom surface of the component body 20 (the first surface 22a of the magnetic layer 22). In the first and second example models, the real part and the imaginary part of the complex relative permeability of the substrate 21 are 1 and 0, respectively, and the real part and the imaginary part of the complex relative permeability of the magnetic layer 22 are 4.0 and 0.04, respectively.

The comparative example model uses an LC composite component of a comparative example. The LC composite component of the comparative example is provided with a dielectric layer of a comparative example instead of the magnetic layer 22. The LC composite component of the comparative example otherwise has the same configuration as that of the LC composite component 1 according to the first embodiment. The dielectric layer of the comparative example has a first surface facing toward the same direction as the first surface 21a of the substrate 21, and a second surface facing toward the same direction as the second surface 21b of the substrate 21. In the comparative example model, the real part and the imaginary part of the complex relative permeability of the substrate 21 are 1 and 0, respectively, and the real part and the imaginary part of the complex relative permeability of the dielectric layer are 1 and 0, respectively. Like the second example model, the comparative example model is a model with two metal shield plates provided near the LC composite component of the comparative example such that one of the two metal shield plates faces the top surface of the component body 20 (the second surface 21b of the substrate 21) of the LC composite component of the comparative example and the other faces the bottom surface of the component body 20 (the first surface of the dielectric layer of the comparative example).

The second simulation determined the frequency response of insertion loss for each of the first and second example and comparative example models. The LC composite component of the comparative example was designed so that the model thereof alone had an insertion loss showing the same frequency response as that of the insertion loss of the first example model.

Figure 8:
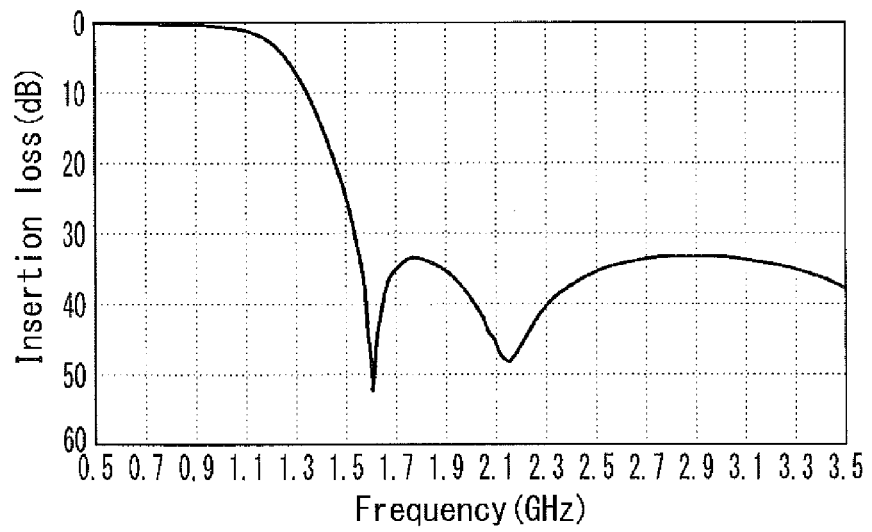
FIG. 8 is a characteristic diagram showing the frequency response of the insertion loss of a first example model.
Figure 9:
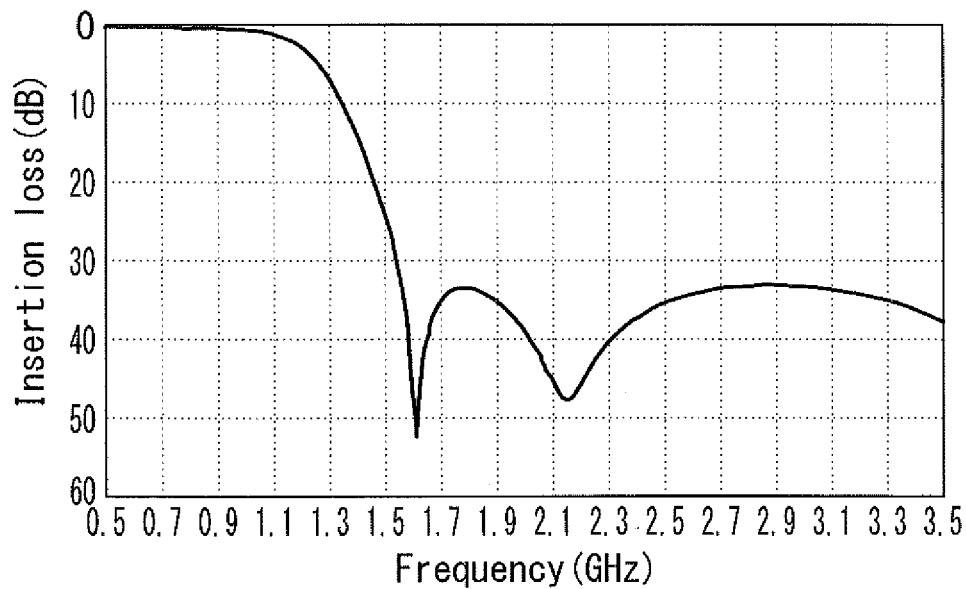
FIG. 9 is a characteristic diagram showing the frequency response of the insertion loss of a second example model.
Figure 10:
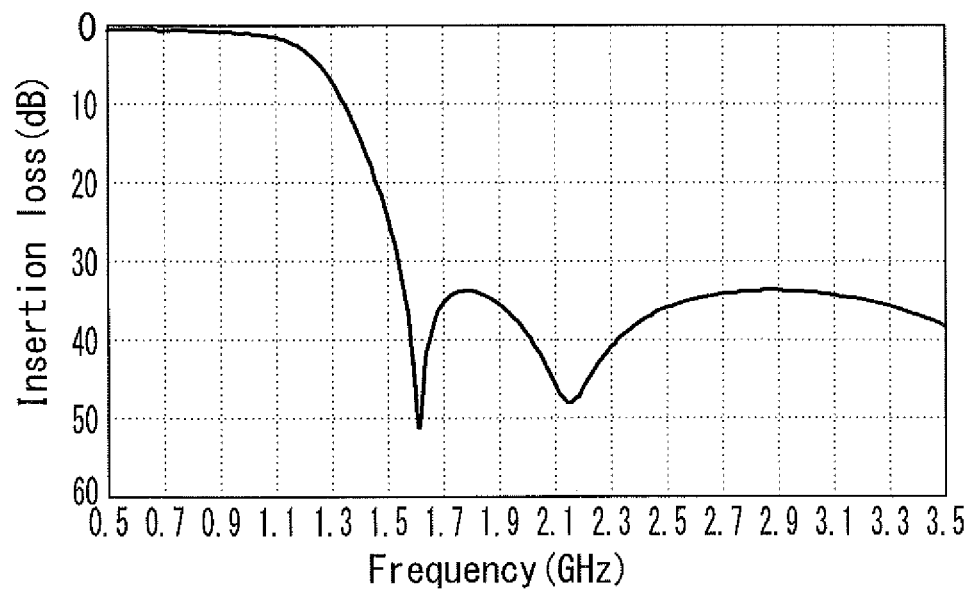
FIG. 10 is a characteristic diagram showing the frequency response of the insertion loss of a comparative example model.

FIG. 8 is a characteristic diagram showing the frequency response of the insertion loss of the first example model. FIG. 9 is a characteristic diagram showing the frequency response of the insertion loss of the second example model. FIG. 10 is a characteristic diagram showing the frequency response of the insertion loss of the comparative example model. In each of FIGS. 8 to 10, the horizontal axis represents frequency, and the vertical axis represents insertion loss. The insertion losses of the first and second example models and the comparative example model at specific frequencies (0.787 GHz and 0.96 GHz) within the pass band were as follows. The first example model showed insertion losses of 0.43 dB and 0.66 dB at 0.787 GHz and 0.96 GHz, respectively. The second example model showed insertion losses of 0.44 dB and 0.68 dB at 0.787 GHz and 0.96 GHz, respectively. The comparative example model showed insertion losses of 0.82 dB and 1.06 dB at 0.787 GHz and 0.96 GHz, respectively.

The comparative example model showed greater insertion losses in the pass band than those of the first example model.

This is presumably because the comparative example model lacked the electromagnetic shielding effect by the magnetic layer 22 and thus suffered large inductor losses due to eddy current losses attributable to the shield plates. In contrast, the second example model showed nearly the same insertion losses in the pass band as those of the first example model. The results of the second simulation indicate that the first embodiment attains electromagnetic shielding effect by virtue of the magnetic layer 22.

Second Embodiment

Figure 11:
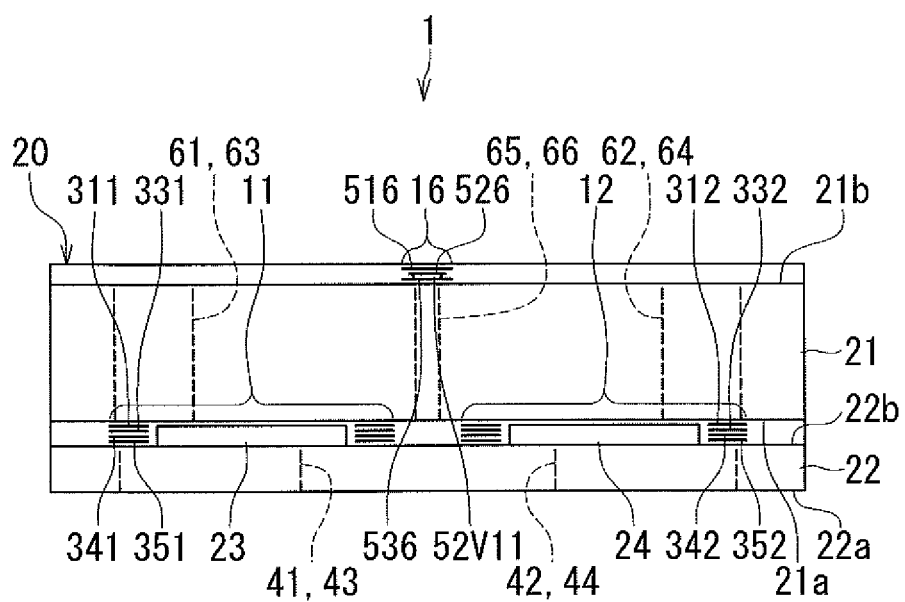
FIG. 11 is a cross-sectional view of an LC composite component according to a second embodiment of the invention.

An LC composite component 1 according to a second embodiment of the invention will now be described. First, reference is made to FIG. 11 to describe the general configuration of the LC composite component 1 according to the second embodiment. FIG. 11 is a cross-sectional view of the LC composite component 1 according to the second embodiment. The LC composite component 1 according to the second embodiment has the same circuit configuration as that according to the first embodiment, which is as shown in FIG. 3.

The second embodiment differs from the first embodiment in the layout of the one or more capacitors (the capacitors 13 to 16) of the LC composite component 1. In the second embodiment, as shown in FIG. 11, the capacitor 16 is disposed on a side of the substrate 21 opposite from the inductors 11, 12 and 17, that is, disposed on the second-surface-21b side of the substrate 21. Although not illustrated, the other three capacitors 13 to 15 are also disposed on the side of the substrate 21 opposite from the inductors 11, 12 and 17, that is, disposed on the second-surface-21b side of the substrate 21.

Now, the specific configuration of the LC composite component 1 according to the second embodiment will be described with reference to FIGS. 12A to 13C. In the second embodiment, a plurality of stacked dielectric layers are provided on both of the first-surface-21a side and the second-surface-21b side of the substrate 21. More specifically, the LC composite component 1 includes dielectric layers 31, 33, 34, 35 and 36 disposed between the first surface 21a of the substrate 21 and the second surface 22b of the magnetic layer 22, and dielectric layers 51, 52 and 53 disposed on the second-surface-21b side of the substrate 21. The dielectric layers 31, 33, 34, 35 and 36 are arranged in this order from the first-surface-21a side of the substrate 21. The dielectric layers 51 to 53 are arranged in the order of 53, 52, and 51 from the second-surface-21b side of the substrate 21. Each of the dielectric layers 31, 33 to 36 and 51 to 53 has a first surface facing toward the same direction as the first surface 21a of the substrate 21, and a second surface facing toward the same direction as the second surface 21b of the substrate 21.

The LC composite component 1 further includes a protective dielectric layer formed of a dielectric material and disposed on the second surface of the dielectric layer 51. The protective dielectric layer has a first surface facing toward the same direction as the first surface 21a of the substrate 21, and a second surface facing toward the same direction as the second surface 21b of the substrate 21. In the second embodiment, the top surface of the component body 20 of the LC composite component 1 is constituted by the second surface of the protective dielectric layer.

In the second embodiment, the core sections 23 and 24 are embedded in the stack of dielectric layers 31 and 33 to 36. FIGS. 13B and 13C omit the illustration of the core sections 23 and 24.

Figure 12A:
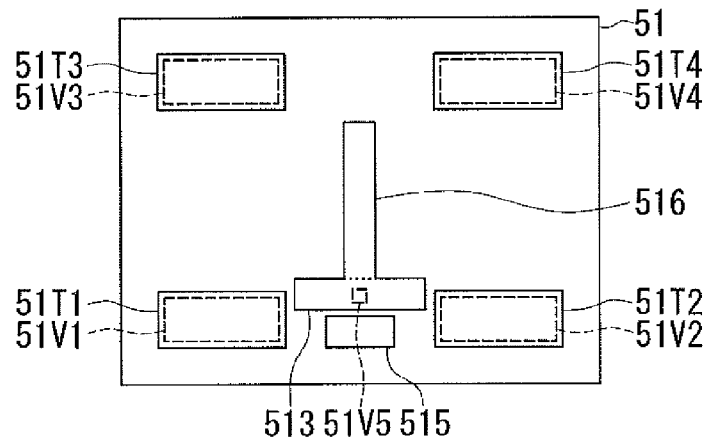
FIGS. 12A to 12C are explanatory diagrams for explaining the structure of the LC composite component shown in FIG. 11.

FIG. 12A shows the second surface of the dielectric layer 51. Capacitor-forming conductor sections 513, 515 and 516 and terminal-forming conductor sections 51T1, 51T2, 51T3 and 51T4 are formed on the second surface of the dielectric layer 51. The layout of the conductor sections 513, 515, 516 and 51T1 to 51T4 in FIG. 12A is the same as the layout of the conductor sections 313, 315, 316 and 31T1 to 31T4 in FIG. 4A described in the first embodiment section.

The LC composite component 1 includes conductor sections 51V1, 51V2, 51V3, 51V4 and 51V5 penetrating the dielectric layers 51 and 52. In FIG. 12A the conductor sections 51V1 to 51V5 are shown in broken lines. Respective one ends of the conductor sections 51V1 to 51V4 and 51V5 are connected to the conductor sections 51T1 to 51T4 and 513, respectively.

Figure 12B:
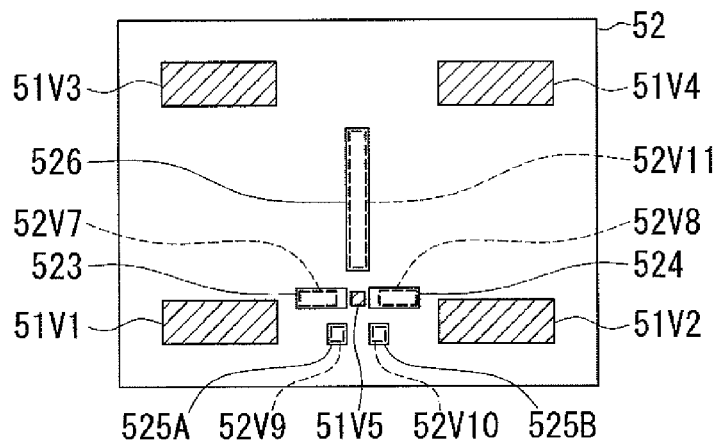

FIG. 12B shows the second surface of the dielectric layer 52. Capacitor-forming conductor sections 523, 524, 525A, 525B and 526 are formed on the second surface of the dielectric layer 52. The layout of the conductor sections 523, 524, 525A, 525B and 526 in FIG. 12B is the same as the layout of the conductor sections 323, 324, 325A, 325B and 326 in FIG. 4B described in the first embodiment section.

The conductor sections 523 and 524 are opposed to the conductor section 513 shown in FIG. 12A with the dielectric layer 51 interposed between the conductor section 513 and the conductor sections 523, 524. The capacitor 13 of the second embodiment is constituted by the conductor sections 513 and 523 and a portion of the dielectric layer 51 that lies therebetween. The capacitor 14 of the second embodiment is constituted by the conductor sections 513 and 524 and a portion of the dielectric layer 51 that lies therebetween. The conductor sections 525A and 525B are opposed to the conductor section 515 shown in FIG. 12A with the dielectric layer 51 interposed between the conductor section 515 and the conductor sections 525A, 525B. The capacitor 15 of the second embodiment is constituted by the conductor sections 515, 525A and 525B and a portion of the dielectric layer 51 that lies between the conductor section 515 and the conductor sections 525A, 525B. The conductor section 526 is opposed to the conductor section 516 shown in FIG. 12A with the dielectric layer 51 interposed therebetween. The capacitor 16 of the second embodiment is constituted by the conductor sections 516 and 526 and a portion of the dielectric layer 51 that lies therebetween.

The conductor sections 51V1 to 51V5 are hatched in FIG. 12B. The LC composite component 1 includes conductor sections 52V7, 52V8, 52V9, 52V10 and 52V11 penetrating the dielectric layer 52. In FIG. 12B the conductor sections 52V7 to 52V11 are shown in broken lines. Respective one ends of the conductor sections 52V7, 52V8, 52V9, 52V10 and 52V11 are connected to the conductor sections 523, 524, 525A, 525B and 526, respectively.

Figure 12C:
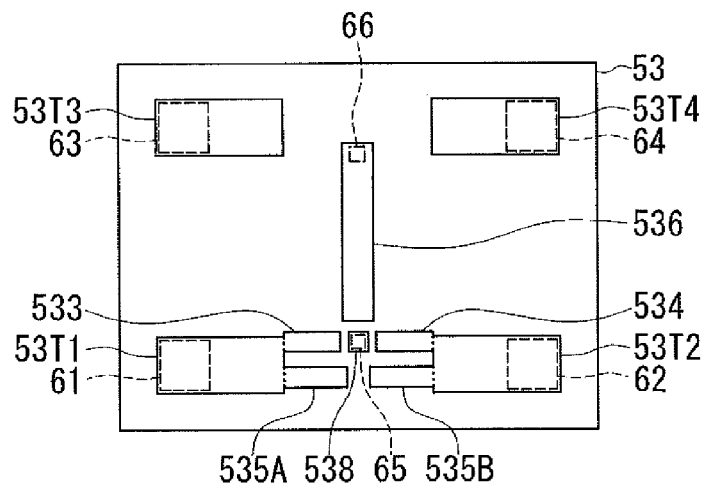

FIG. 12C shows the second surface of the dielectric layer 53. Connection conductor sections 533, 534, 535A, 535B, 536 and 538 and terminal-forming conductor sections 53T1, 53T2, 53T3 and 53T4 are formed on the second surface of the dielectric layer 53. The layout of the conductor sections 533, 534, 535A, 353B, 536 and 53T1 to 53T4 in FIG. 12C is the same as the layout of the conductor sections 333, 334, 335A, 335B, 336 and 33T1 to 33T4 in FIG. 4C described in the first embodiment section. The conductor section 538 is disposed between the conductor section 533 and the conductor section 534.

The conductor sections 538 and 53T1 to 53T4 are disposed to overlap the conductor sections 513 and 51T1 to 51T4 shown in FIG. 12A, respectively, when viewed in the direction perpendicular to the first surface 21a of the substrate 21, i.e., the direction perpendicular to the first surface of the dielectric layer 53. The conductor sections 533, 534, 535A, 535B and 536 are disposed to overlap the conductor sections 523, 524, 525A, 525B and 526 shown in FIG. 12B, respectively, when viewed in the direction perpendicular to the first surface 21a of the substrate 21.

The respective other ends of the conductor sections 51V1 to 51V4 and 51V5 shown in FIGS. 12A and 12B are connected to the conductor sections 53T1 to 53T4 and 538, respectively. The respective other ends of the conductor sections 52V7, 52V8, 52V9, 52V10 and 52V11 shown in FIG. 12B are connected to the conductor sections 533, 534, 535A, 535B and 536, respectively.

The LC composite component 1 includes connection conductor sections 61, 62, 63, 64, 65 and 66 penetrating the substrate 21 and the dielectric layers 31 and 53. In FIG. 12C the conductor sections 61 to 66 are shown in broken lines. Respective one ends of the conductor sections 61 to 64, 65 and 66 are connected to the conductor sections 53T1 to 53T4, 538 and 536, respectively.

Figure 13A:
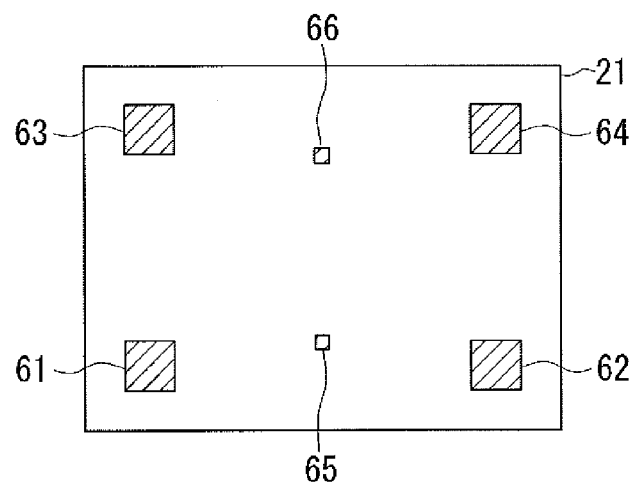
FIGS. 13A to 13C are explanatory diagrams for explaining the structure of the LC composite component shown in FIG. 11.
Figure 13B:
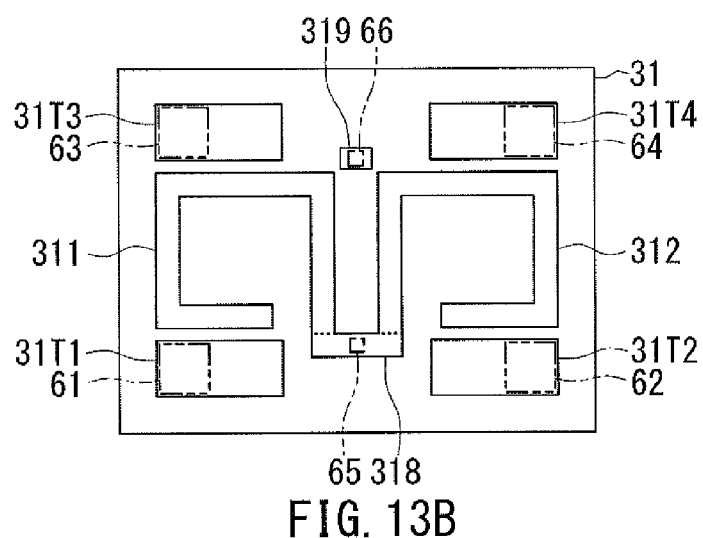
Figure 13C:
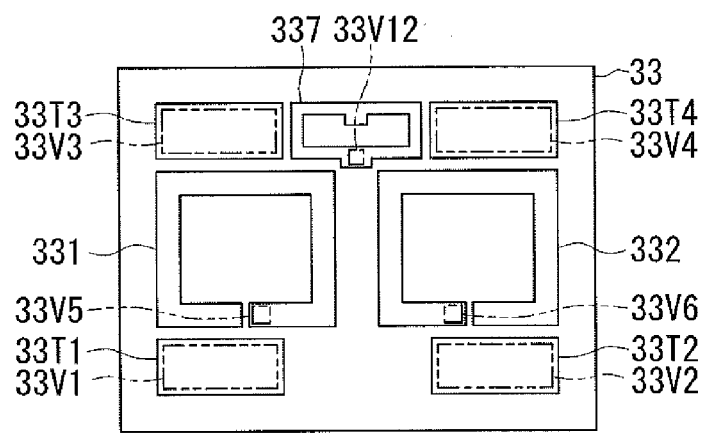

FIG. 13A shows the substrate 21 and the conductor sections 61 to 66 penetrating the substrate 21. The conductor sections 61 to 66 are hatched in FIG. 13A.

FIG. 13B shows the first surface of the dielectric layer 31. In the second embodiment, the inductor-forming conductor sections 311 and 312 and the terminal-forming conductor sections 31T1 to 31T4 are formed as in the first embodiment. The above-listed conductor sections are shaped and located as in the first embodiment. In the second embodiment, the conductor sections 31T1 to 31T4 are particularly disposed to overlap the conductor sections 53T1 to 53T4 shown in FIG. 12C, respectively, when viewed in the direction perpendicular to the first surface 21a of the substrate 21, i.e., the direction perpendicular to the first surface of the dielectric layer 31. None of the connection conductor sections 313, 315 and 316 are provided in the second embodiment.

In the second embodiment, connection conductor sections 318 and 319 are further formed on the first surface of the dielectric layer 31. The conductor section 318 is located at a lower position relative to the conductor sections 311 and 312 in FIG. 13B. The conductor section 318 is connected to one end of each of the conductor sections 311 and 312. The conductor section 319 is located at an upper position relative to the conductor sections 311 and 312 in FIG. 13B. The conductor sections 318 and 319 are disposed to overlap the conductor sections 538 and 536 shown in FIG. 12C, respectively, when viewed in the direction perpendicular to the first surface 21a of the substrate 21.

In FIG. 13B the conductor sections 61 to 66 are shown in chain double-dashed lines. The respective other ends of the conductor sections 61 to 64, 65 and 66 are connected to the conductor sections 31T1 to 31T4, 318 and 319, respectively.

FIG. 13C shows the first surface of the dielectric layer 33. In the second embodiment, the inductor-forming conductor sections 331, 332 and 337, the terminal-forming conductor sections 33T1 to 33T4 and the conductor sections 33V1 to 33V6 are formed as in the first embodiment. The above-listed conductor sections are shaped and located as in the first embodiment. In the second embodiment, the conductor section 337 is particularly disposed to overlap the conductor section 319 shown in FIG. 13B when viewed in the direction perpendicular to the first surface 21a of the substrate 21, i.e., the direction perpendicular to the first surface of the dielectric layer 33. The conductor sections 33V1 to 33V6 penetrate only the dielectric layer 33. None of the connection conductor sections 333, 334, 335A, 335B and 336 and none of the conductor sections 33V7 to 33V11 are provided in the second embodiment.

The LC composite component 1 includes a conductor section 33V12 penetrating the dielectric layer 33. In FIG. 13C the conductor section 33V12 is shown in a chain double-dashed line. One end of the conductor section 33V12 is connected to the conductor section 319 shown in FIG. 13B. The other end of the conductor section 33V12 is connected to the conductor section 337.

The parts from the dielectric layer 34 to the magnetic layer 22 are configured in the same manner as the example shown in FIGS. 5A to 5C described in the first embodiment section.

An example of a manufacturing method for the LC composite component 1 according to the second embodiment will now be described briefly. In the second embodiment, first, the parts from the dielectric layer 31 to the dielectric layer 36 (except the core sections 23 and 24 and the terminal-forming conductor sections 41 to 44) are formed on the first surface 21a of the substrate 21 in the same manner as the example of the manufacturing method for the LC composite component 1 according to the first embodiment. Next, the dielectric layer 53 is formed on the second surface 21b of the substrate 21. Six holes for the connection conductor sections 61 to 66 are then formed in the substrate 21 and the dielectric layers 31 and 53. Then, the conductor sections 61 to 66 are formed in the six holes. The other conductor sections shown in FIG. 12C are formed on the dielectric layer 53 and the conductor sections 61 to 66. Next, the parts from the dielectric layer 52 to the protective dielectric layer are formed. The remainder of steps of the manufacturing method for the LC composite component 1 according to the second embodiment are the same as those of the manufacturing method according to the first embodiment.

Among the constituent parts of the LC composite component 1, the parts from the protective dielectric layer to the dielectric layer 36 (except the core sections 23 and 24 and the terminal-forming conductor sections 41 to 44) may be formed by a low-temperature co-firing method.

In the second embodiment, the capacitors 13 to 16 are disposed on the side of the substrate 21 opposite from the inductors 11, 12 and 17. The second embodiment thereby allows for an increase in the distance from the capacitor-forming conductor sections to the inductor-forming conductor sections, and consequently allows the LC composite component 1 to be less susceptible to characteristic degradation resulting from losses of the inductors 11, 12 and 17.

The remainder of configuration, operation and effects of the second embodiment are similar to those of the first embodiment.

Third Embodiment

Figure 14:
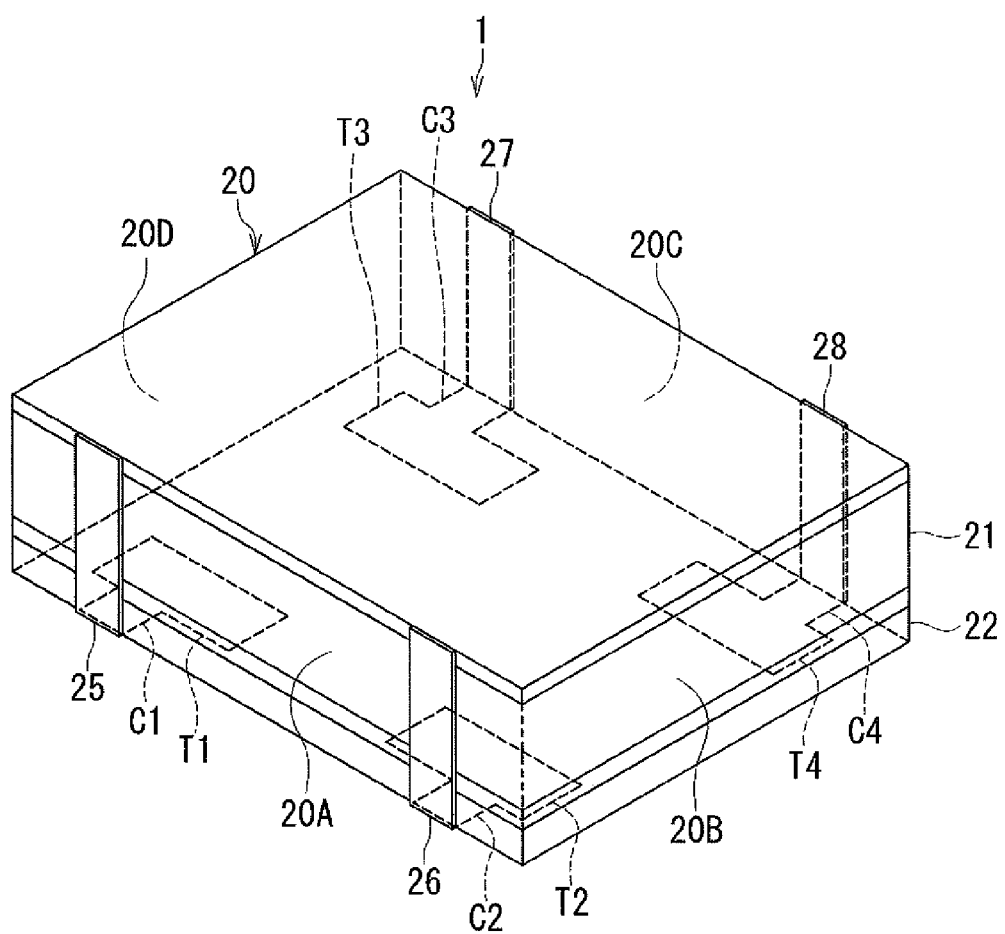
FIG. 14 is an external perspective view of an LC composite component according to a third embodiment of the invention.

An LC composite component 1 according to a third embodiment of the invention will now be described. First, reference is made to FIG. 14 to describe the general configuration of the LC composite component 1 according to the third embodiment. FIG. 14 is an external perspective view of the LC composite component 1 according to the third embodiment. The LC composite component 1 according to the third embodiment has the same circuit configuration as that according to the first embodiment, which is as shown in FIG. 3.

None of the terminal-forming conductor sections 41 to 44 and connection conductor sections 61 to 64 described in the second embodiment section are provided in the third embodiment. Instead, the LC composite component 1 according to the third embodiment includes four outer conductor layers 25, 26, 27 and 28 each disposed on any of the four side surfaces of the component body 20, and further includes four terminal-forming conductor sections T1, T2, T3 and T4 and four connection conductor sections C1, C2, C3 and C4 disposed on the bottom surface of the component body 20. In the third embodiment, the outer conductor layers 25 and 26 are disposed on the same one of the four side surfaces, i.e., the side surface facing toward the lower left in FIG. 14. Hereinafter, the side surface on which the outer conductor layers 25 and 26 are disposed will be called the first surface and denoted by reference symbol 20A. The side surface facing toward the lower right in FIG. 14 will be called the second side surface and denoted by reference symbol 20B. The side surface facing toward the upper right in FIG. 14 will be called the third side surface and denoted by reference symbol 20C. The side surface facing toward the upper left in FIG. 14 will be called the fourth side surface and denoted by reference symbol 20D. The outer conductor layers 27 and 28 are disposed on the third side surface 20C.

The outer conductor layer 25 is located near the ridge between the first side surface 20A and the fourth side surface 20D. The outer conductor layer 26 is located near the ridge between the first side surface 20A and the second side surface 20B. One end of each of the outer conductor layers 25 and 26 is located near the ridge between the first side surface 20A and the bottom surface of the component body 20. The other end of each of the outer conductor layers 25 and 26 is located near the ridge between the first side surface 20A and the top surface of the component body 20.

The outer conductor layer 27 is located near the ridge between the third side surface 20C and the fourth side surface 20D. The outer conductor layer 28 is located near the ridge between the second side surface 20B and the third side surface 20C. One end of each of the outer conductor layers 27 and 28 is located near the ridge between the third side surface 20C and the bottom surface of the component body 20. The other end of each of the outer conductor layers 27 and 28 is located near the ridge between the third side surface 20C and the top surface of the component body 20.

The terminal-forming conductor sections T1 to T4 are connected to the respective one ends of the outer conductor layers 25 to 28 via the connection conductor sections C1 to C4, respectively. The terminal-forming conductor section T1 constitutes the input terminal 2 of the third embodiment. The terminal-forming conductor section T2 constitutes the output terminal 3 of the third embodiment. The terminal-forming conductor sections T3 and T4 constitute ground terminals connected to the ground.

Now, the specific configuration of the LC composite component 1 according to the third embodiment will be described with reference to FIGS. 15A to 17C. The LC composite component 1 according to the third embodiment includes the dielectric layers 31, 33, 34, 35, 36, 51, 52 and 53 and the protective dielectric layer which are disposed in the same manner as the second embodiment. The core sections 23 and 24 are embedded in the stack of the dielectric layers 31 and 33 to 36 as in the second embodiment. FIGS. 16B to 17B omit the illustration of the core sections 23 and 24.

Figure 15A:
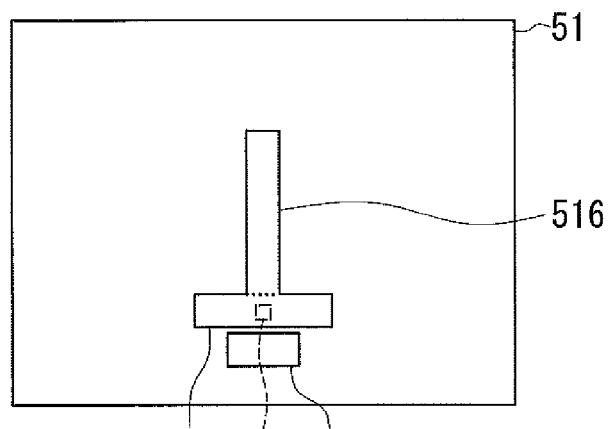
FIGS. 15A to 15C are explanatory diagrams for explaining the structure of the LC composite component shown in FIG. 14.
Figure 15B:
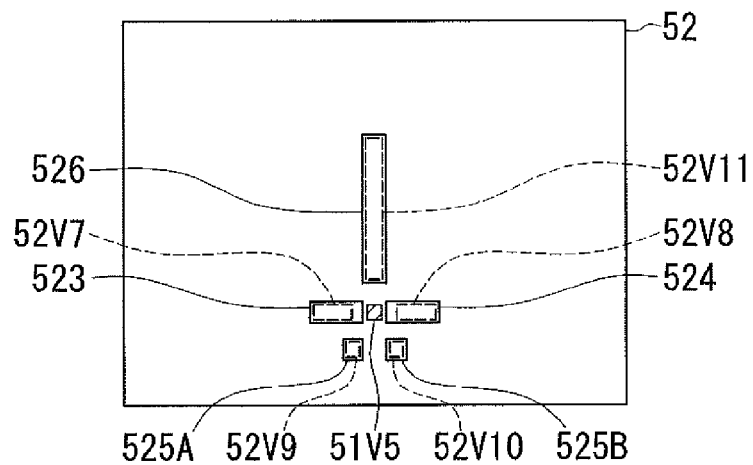
Figure 15C:
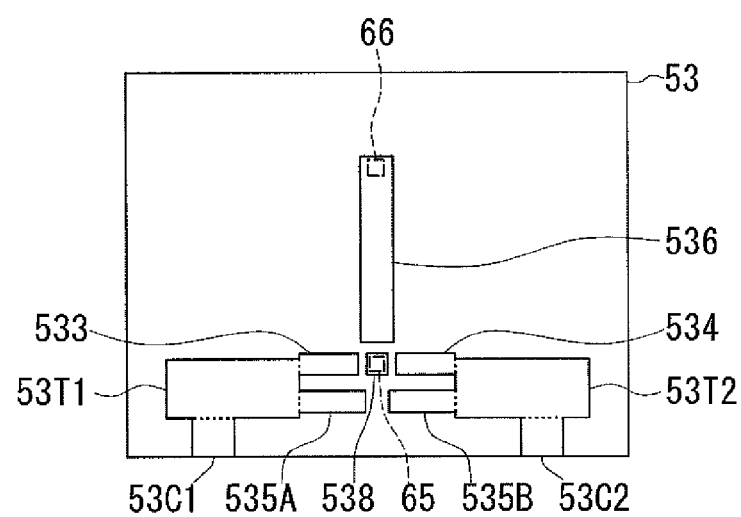

FIG. 15A shows the second surface of the dielectric layer 51. FIG. 15B shows the second surface of the dielectric layer 52. FIG. 15C shows the second surface of the dielectric layer 53. In the third embodiment, the capacitor-forming conductor sections 513, 515, 516, 523, 524, 525A, 525B and 526, the connection conductor sections 533, 534, 535A, 535B, 536 and 538, the terminal-forming conductor sections 53T1 and 53T2, the conductor sections 51V5 and 52V7 to 52V11, and the connection conductor sections 65 and 66 are formed as in the second embodiment. The above-listed conductor sections are shaped and located as in the second embodiment. None of the terminal-forming conductor sections 51T1 to 51T4, 53T3 and 53T4, none of the conductor sections 51V1 to 51V4, and none of the connection conductor sections 61 to 64 are provided in the third embodiment.

In the third embodiment, as shown in FIG. 15C, two connection conductor sections 53C1 and 53C2 are further formed on the second surface of the dielectric layer 53. Respective one ends of the conductor sections 53C1 and 53C2 are connected to the conductor sections 53T1 and 53T2, respectively. The respective other ends of the conductor sections 53C1 and 53C2 are connected to the outer conductor layers 25 and 26 shown in FIG. 14, respectively.

Figure 16A:
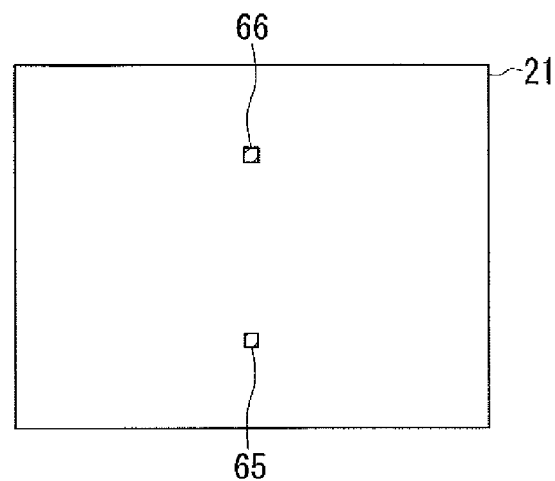
FIGS. 16A to 16C are explanatory diagrams for explaining the structure of the LC composite component shown in FIG. 14.
Figure 16B:
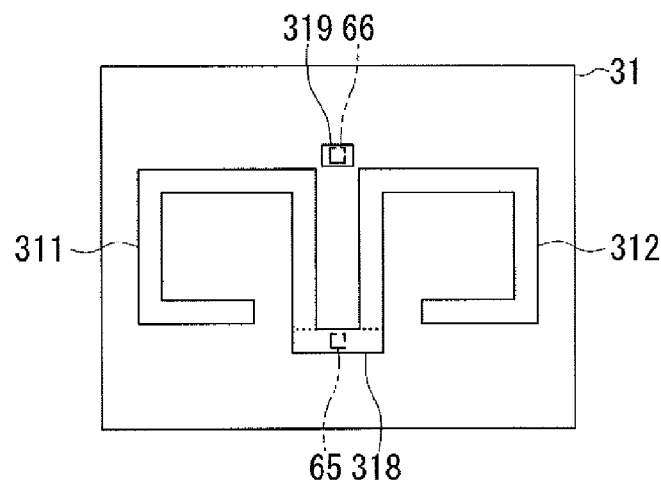
Figure 16C:
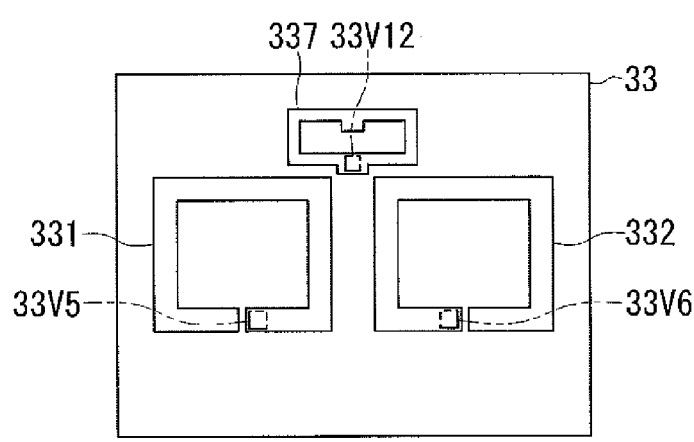

FIG. 16A shows the substrate 21 and the conductor sections 65 and 66 penetrating the substrate 21. FIG. 16B shows the first surface of the dielectric layer 31. FIG. 16C shows the first surface of the dielectric layer 33. In the third embodiment, the inductor-forming conductor sections 311, 312, 331, 332 and 337, the connection conductor sections 318 and 319, the conductor sections 33V5, 33V6 and 33V12, and the connection conductor sections 65 and 66 are formed as in the second embodiment. The above-listed conductor sections are shaped and located as in the second embodiment. None of the terminal-forming conductor sections 31T1 to 31T4 and 33T1 to 33T4, and none of the conductor sections 33V1 to 33V4 are provided in the third embodiment.

Figure 17A:
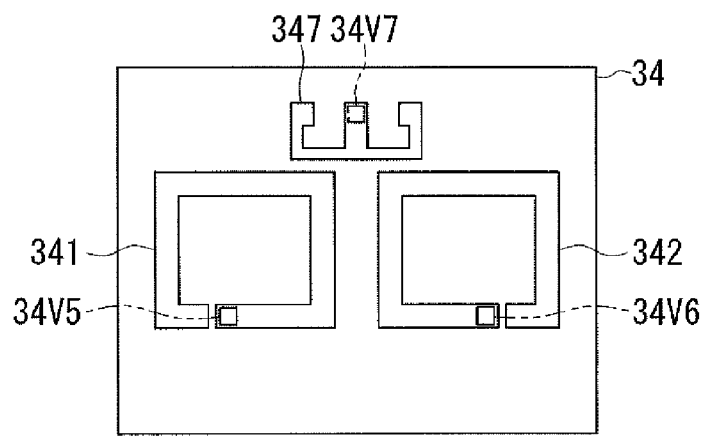
FIGS. 17A to 17C are explanatory diagrams for explaining the structure of the LC composite component shown in FIG. 14.
Figure 17B:
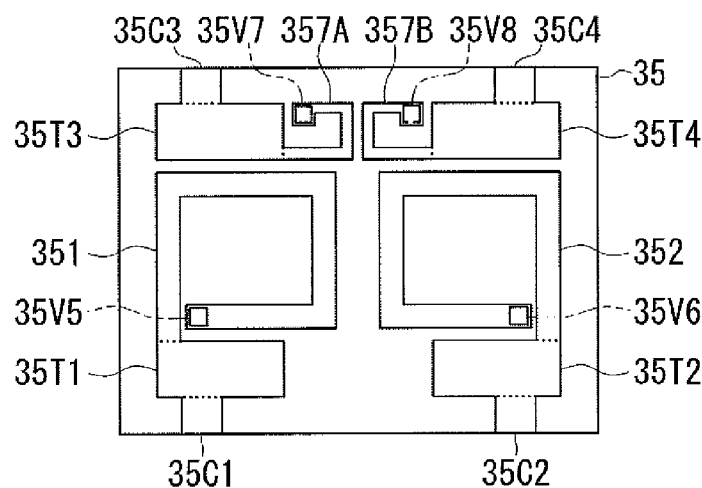

FIG. 17A shows the first surface of the dielectric layer 34. FIG. 17B shows the first surface of the dielectric layer 35. In the third embodiment, the inductor-forming conductor sections 341, 342, 347, 351, 352, 357A and 357B, the terminal-forming conductor sections 35T1 to 35T4, and the conductor sections 34V5 to 34V7 and 35V5 to 35V8 are formed as in the second embodiment (the first embodiment). The above-listed conductor sections are shaped and located as in the second embodiment (the first embodiment). None of the terminal-forming conductor sections 34T1 to 34T4 are provided in the third embodiment.

In the third embodiment, as shown in FIG. 17B, four connection conductor sections 35C1, 35C2, 35C3 and 35C4 are further formed on the first surface of the dielectric layer 35. Respective one ends of the conductor sections 35C1 to 35C4 are connected to the conductor sections 35T1 to 35T4, respectively. The respective other ends of the conductor sections 35C1 to 35C4 are connected to the outer conductor layers 25 to 28 shown in FIG. 14, respectively.

Figure 17C:
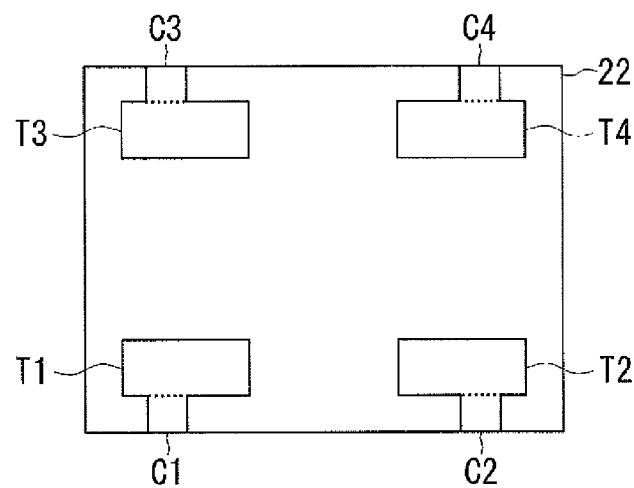

FIG. 17C shows the first surface 22a of the magnetic layer 22. None of the terminal-forming conductor sections 41 to 44 are provided in the third embodiment. Instead, the terminal-forming conductor sections T1 to T4 and the connection conductor sections C1 to C4 are formed on the first surface 22a of the magnetic layer 22. FIG. 17C shows the aforementioned conductor sections as viewed from the second-surface-22b side of the magnetic layer 22. The layout of the aforementioned conductor sections in FIG. 17C is as follows. The conductor section T1 is located near the lower left corner. The conductor section T2 is located near the lower right corner. The conductor section T3 is located near the upper left corner. The conductor section T4 is located near the upper right corner.

Respective one ends of the conductor sections C1 to C4 are connected to the conductor sections T1 to T4, respectively. The respective other ends of the conductor sections C1 to C4 are connected to the outer conductor layers 25 to 28 shown in FIG. 14, respectively. The conductor sections T1 to T4 are disposed to overlap the conductor sections 35T1 to 35T4 shown in FIG. 17B, respectively, when viewed in the direction perpendicular to the first surface 21a of the substrate 21, i.e., the direction perpendicular to the first surface 22a of the magnetic layer 22.

An example of a manufacturing method for the LC composite component 1 according to the third embodiment will now be described briefly. In the third embodiment, first, the component body 20 is produced in the same manner as the second embodiment. Next, the outer conductor layers 25 and 26 are formed on the first side surface 20A of the component body 20, the outer conductor layers 27 and 28 are formed on the third side surface 20C of the component body 20, and the terminal-forming conductor sections T1 to T4 and the connection conductor sections C1 to C4 are formed on the bottom surface of the component body 20.

The remainder of configuration, operation and effects of the third embodiment are similar to those of the second embodiment.

Fourth Embodiment

Figure 18:
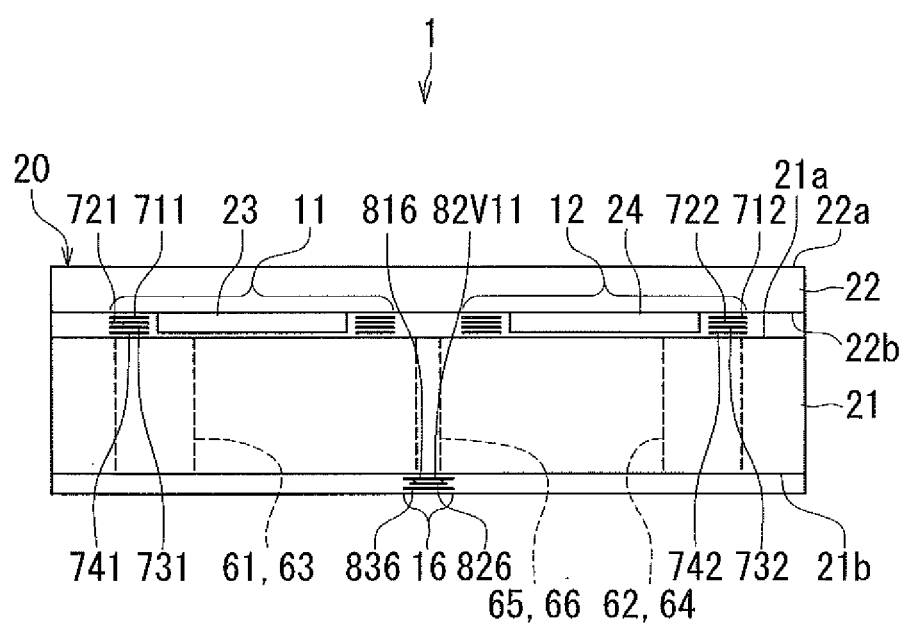
FIG. 18 is a cross-sectional view of an LC composite component according to a fourth embodiment of the invention.

An LC composite component 1 according to a fourth embodiment of the invention will now be described. First, reference is made to FIG. 18 to describe the general configuration of the LC composite component 1 according to the fourth embodiment. FIG. 18 is a cross-sectional view showing the configuration of the LC composite component 1 according to the fourth embodiment. The LC composite component 1 according to the fourth embodiment has the same circuit configuration as that according to the first embodiment, which is as shown in FIG. 3.

In the LC composite component 1 according to the fourth embodiment, as shown in FIG. 18, the relative vertical positioning of the substrate 21, the magnetic layer 22, the stack of dielectric layers in which the inductors 11, 12 and 17 are formed, and the stack of dielectric layers in which the capacitors 13 to 16 are formed is reversed from that in the second embodiment. In the fourth embodiment, the first surface 21a of the substrate 21 and the first surface 22a of the magnetic layer 22 face upward, whereas the second surface 21b of the substrate 21 and the second surface 22b of the magnetic layer 22 face downward. In the fourth embodiment, the capacitors 13 to 16 are disposed on the side of the substrate 21 opposite from the inductors 11, 12 and 17, that is, disposed on the second-surface-21b side of the substrate 21, as in the second embodiment.

Now, the specific configuration of the LC composite component 1 according to the fourth embodiment will be described with reference to FIGS. 19A to 21C. In the fourth embodiment, a plurality of stacked dielectric layers are provided on both of the first-surface-21a side and the second-surface-21b side of the substrate 21. More specifically, the LC composite component 1 includes dielectric layers 71, 72, 73 and 74 disposed between the first surface 21a of the substrate 21 and the second surface 22b of the magnetic layer 22, and dielectric layers 81, 82, 83 and 84 disposed on the second-surface-21b side of the substrate 21. The dielectric layers 71 to 74 are arranged in the order of 74, 73, 72 and 71 from the first-surface-21a side of the substrate 21. The dielectric layers 81, 82, 83 and 84 are arranged in this order from the second-surface-21b side of the substrate 21. Each of the dielectric layers 71 to 74 and 81 to 84 has a first surface facing toward the same direction as the first surface 21a of the substrate 21, and a second surface facing toward the same direction as the second surface 21b of the substrate 21. The LC composite component 1 further includes a protective dielectric layer formed of a dielectric material and disposed between the first surface of the dielectric layer 71 and the second surface 22b of the magnetic layer 22.

In the fourth embodiment, the top surface of the component body 20 of the LC composite component 1 is constituted by the first surface 22a of the magnetic layer 22. The bottom surface of the component body 20 of the LC composite component 1 is constituted by the second surface of the dielectric layer 84. The LC composite component 1 is mounted onto a mounting board (not illustrated) with the bottom surface of the component body 20 or the second surface of the dielectric layer 84 toward the top surface of the mounting board, for example.

In the fourth embodiment, the core sections 23 and 24 are embedded in a stack of the protective dielectric layer and dielectric layers 71-74. FIGS. 19A to 20A omit the illustration of the core sections 23 and 24.

Figure 19A:
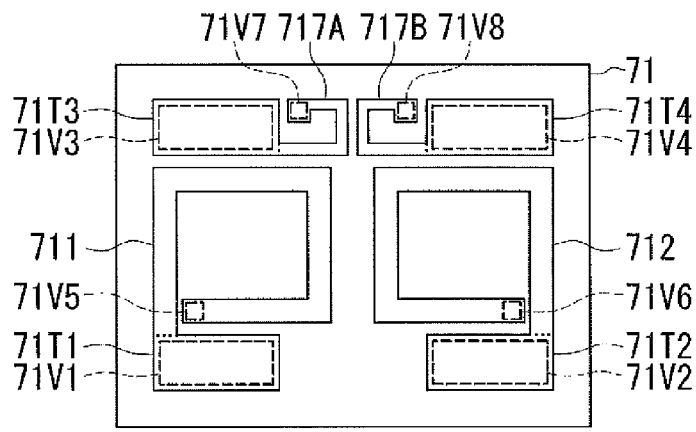
FIGS. 19A to 19C are explanatory diagrams for explaining the structure of the LC composite component shown in FIG. 18.

FIG. 19A shows the first surface of the dielectric layer 71. Inductor-forming conductor sections 711, 712, 717A and 717B and terminal-forming conductor sections 71T1, 71T2, 71T3 and 71T4 are formed on the first surface of the dielectric layer 71. The layout of the conductor sections 711, 712, 717A, 717B and 71T1 to 7114 in FIG. 19A is the same as the layout of the conductor sections 351, 352, 357A, 347B and 35T1 to 35T4 in FIG. 5B described in the first embodiment section. The conductor sections 711 and 712 are the same in shape as the conductor sections 351 and 352 described in the first embodiment section.

The LC composite component 1 includes conductor sections 71V1, 71V2, 71V3, 71V4, 71V5, 71V6, 71V7 and 71V8 penetrating the dielectric layer 71. In FIG. 19A the conductor sections 71V1 to 71V8 are shown in broken lines. Respective one ends of the conductor sections 71V1 to 71V4, 71V5, 71V6, 71V7 and 71V8 are connected to the conductor sections 71T1 to 71T4, 711, 712, 717A and 717B, respectively.

Figure 19B:
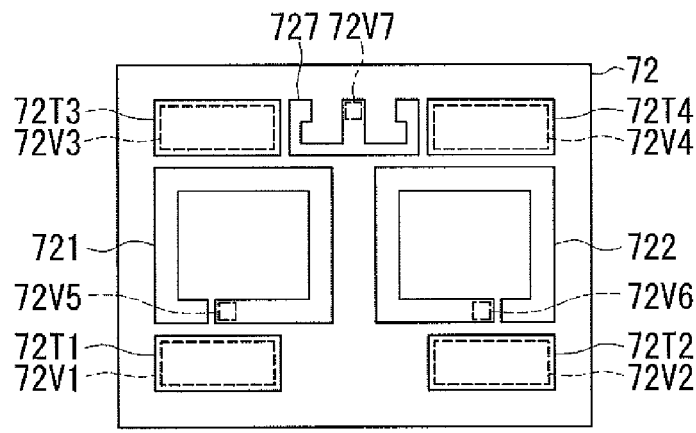

FIG. 19B shows the first surface of the dielectric layer 72. Inductor-forming conductor sections 721, 722 and 727 and terminal-forming conductor sections 72T1, 72T2, 72T3 and 72T4 are formed on the first surface of the dielectric layer 72. The layout of the conductor sections 721, 722, 727 and 72T1 to 72T4 in FIG. 19B is the same as the layout of the conductor sections 341, 342, 347 and 34T1 to 34T4 in FIG. 5A described in the first embodiment section. The conductor sections 721 and 722 are the same in shape as the conductor sections 341 and 342 described in the first embodiment section.

The conductor sections 721, 722 and 72T1 to 72T4 are disposed to overlap the conductor sections 711, 712 and 71T1 to 71T4 shown in FIG. 19A, respectively, when viewed in the direction perpendicular to the first surface 21a of the substrate 21, i.e., the direction perpendicular to the first surface of the dielectric layer 72. The conductor section 727 is disposed to overlap the conductor sections 717A and 717B shown in FIG. 19A when viewed in the direction perpendicular to the first surface 21a of the substrate 21. The respective other ends of the conductor sections 71V1 to 71V4, 71V5 and 71V6 are connected to the conductor sections 72T1 to 72T4, 721 and 722, respectively. The other end of each of the conductor sections 71V7 and 71V8 is connected to the conductor section 727.

The LC composite component 1 includes conductor sections 72V1, 72V2, 72V3, 72V4, 72V5, 72V6 and 72V7 penetrating the dielectric layer 72. In FIG. 19B the conductor sections 72V1 to 72V7 are shown in broken lines. Respective one ends of the conductor sections 72V1 to 72V4, 72V5, 72V6 and 72V7 are connected to the conductor sections 72T1 to 72T4, 721, 722 and 727, respectively.

Figure 19C:
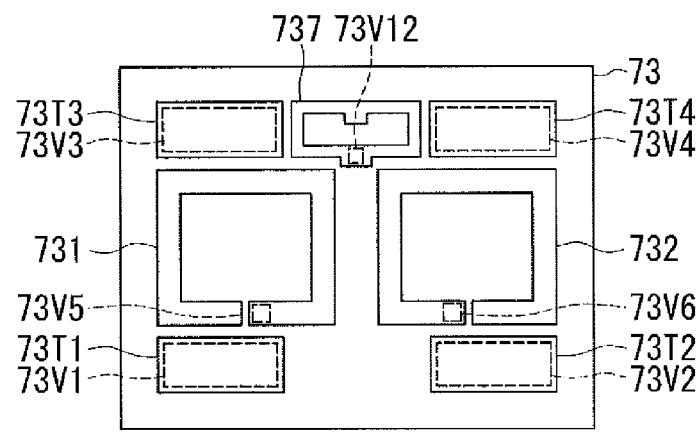

FIG. 19C shows the first surface of the dielectric layer 73. Inductor-forming conductor sections 731, 732 and 737 and terminal-forming conductor sections 73T1, 73T2, 73T3 and 73T4 are formed on the first surface of the dielectric layer 73. The layout of the conductor sections 731, 732, 737 and 73T1 to 73T4 in FIG. 19C is the same as the layout of the conductor sections 331, 332, 337 and 33T1 to 33T4 in FIG. 13C described in the second embodiment section. The conductor sections 731 and 732 are the same in shape as the conductor sections 331 and 332 described in the second embodiment (the first embodiment) section.

The conductor sections 731, 732, 737 and 73T1 to 73T4 are disposed to overlap the conductor sections 721, 722, 727 and 72T1 to 72T4 shown in FIG. 19B, respectively, when viewed in the direction perpendicular to the first surface 21a of the substrate 21, i.e., the direction perpendicular to the first surface of the dielectric layer 73. The respective other ends of the conductor sections 72V1 to 72V4, 72V5, 72V6 and 72V7 shown in FIG. 19B are connected to the conductor sections 73T1 to 73T4, 731, 732 and 737, respectively.

The LC composite component 1 includes conductor sections 73V1, 73V2, 73V3, 73V4, 73V5, 73V6 and 73V12 penetrating the dielectric layer 73. In FIG. 19C the conductor sections 73V1 to 73V6 and 73V12 are shown in broken lines. Respective one ends of the conductor sections 73V1 to 73V4, 73V5, 73V6 and 73V12 are connected to the conductor sections 73T1 to 73T4, 731, 732 and 727, respectively.

Figure 20A:
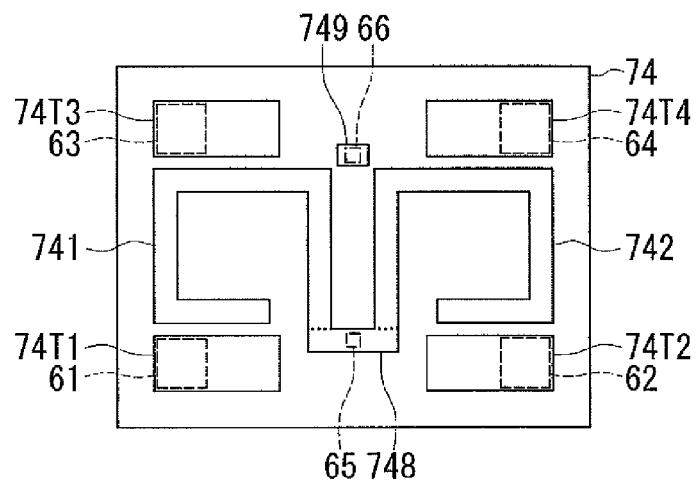
FIGS. 20A to 20C are explanatory diagrams for explaining the structure of the LC composite component shown in FIG. 18.

FIG. 20A shows the first surface of the dielectric layer 74. Inductor-forming conductor sections 741 and 742, connection conductor sections 748 and 749, and terminal-forming conductor sections 74T1, 74T2, 74T3 and 74T4 are formed on the first surface of the dielectric layer 74. The layout of the conductor sections 741, 742, 748, 749 and 74T1 to 74T4 in FIG. 20A is the same as the layout of the conductor sections 311, 312, 318, 319 and 31T1 to 31T4 in FIG. 13B described in the second embodiment section. The conductor sections 741 and 742 are the same in shape as the conductor sections 311 and 312 described in the second embodiment (the first embodiment) section.

The conductor sections 741, 742, 749 and 74T1 to 74T4 are disposed to overlap the conductor sections 731, 732, 737 and 73T1 to 73T4 shown in FIG. 19C, respectively, when viewed in the direction perpendicular to the first surface 21a of the substrate 21, i.e., the direction perpendicular to the first surface of the dielectric layer 74. The respective other ends of the conductor sections 73V1 to 73V4, 73V5, 73V6 and 73V12 shown in FIG. 19C are connected to the conductor sections 74T1 to 74T4, 741, 742 and 749, respectively.

The connection conductor sections 61 to 66 of the fourth embodiment penetrate the substrate 21 and the dielectric layers 74 and 81. In FIG. 20A the conductor sections 61 to 66 are shown in broken lines. Respective one ends of the conductor sections 61 to 64, 65 and 66 are connected to the conductor sections 74T1 to 74T4, 748 and 749, respectively.

Figure 20B:
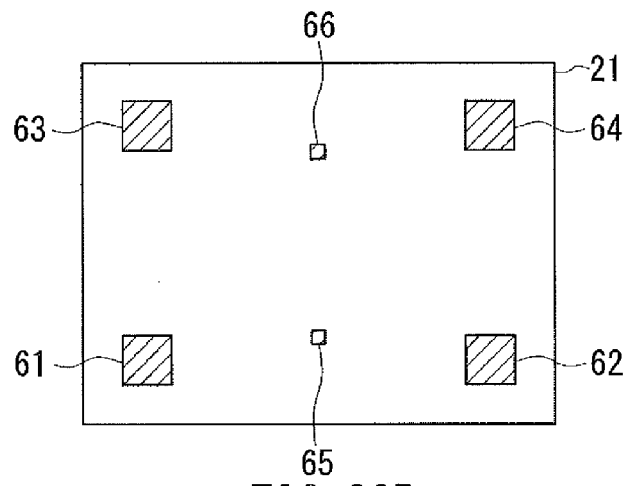

FIG. 20B shows the substrate 21 and the conductor sections 61 to 66 penetrating the substrate 21. The conductor sections 61 to 66 are hatched in FIG. 20B.

Figure 20C:
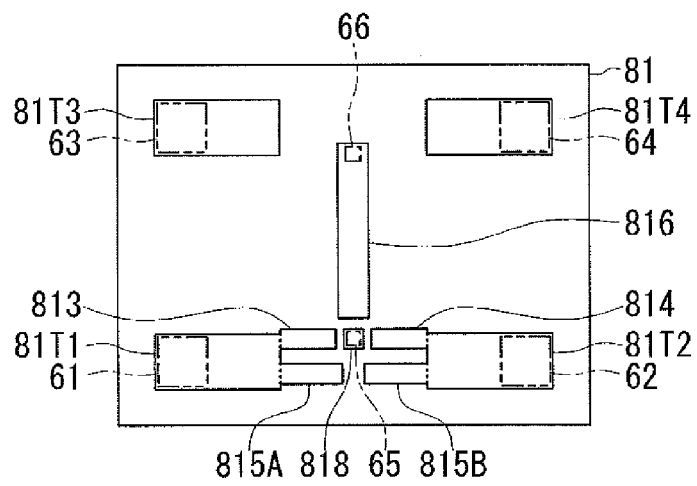

FIG. 20C shows the second surface of the dielectric layer 81. Connection conductor sections 813, 814, 815A, 815B, 816 and 818 and terminal-forming conductor sections 81T1, 8112, 81T3 and 8114 are formed on the second surface of the dielectric layer 81. FIG. 20C illustrates the above-listed conductor sections as viewed from the first-surface side of the dielectric layer 81. The layout of the conductor sections 813, 814, 815A, 815B, 816, 818 and 81T1 to 81T4 in FIG. 20C is the same as the layout of the conductor sections 533, 534, 535A, 535B, 536, 538 and 53T1 to 53T4 in FIG. 12C described in the second embodiment section.

The conductor sections 818, 816 and 81T1 to 81T4 are disposed to overlap the conductor sections 748, 749 and 74T1 to 74T4 shown in FIG. 20A, respectively, when viewed in the direction perpendicular to the first surface 21a of the substrate 21, i.e., the direction perpendicular to the first surface of the dielectric layer 81. In FIG. 20C the conductor sections 61 to 66 are shown in chain double-dashed lines. The respective other ends of the conductor sections 61 to 64, 65 and 66 are connected to the conductor sections 81T1 to 81T4, 818 and 816, respectively.

Figure 21A:
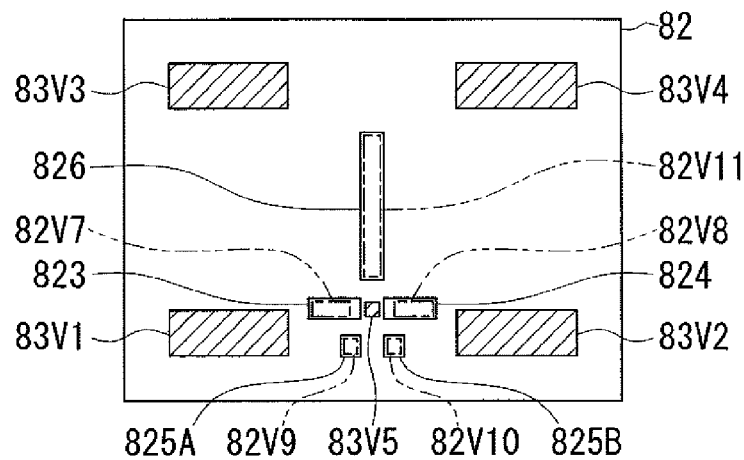
FIGS. 21A to 21C are explanatory diagrams for explaining the structure of the LC composite component shown in FIG. 18.

FIG. 21A shows the second surface of the dielectric layer 82. Capacitor-forming conductor sections 823, 824, 825A, 825B and 826 are formed on the second surface of the dielectric layer 82. FIG. 21A illustrates the above-listed conductor sections as viewed from the first-surface side of the dielectric layer 82. The layout of the conductor sections 823, 824, 825A, 825B and 826 in FIG. 21A is the same as the layout of the conductor sections 523, 524, 525A, 525B and 526 in FIG. 12B described in the second embodiment section.

The conductor sections 823, 824, 825A, 825B and 826 are disposed to overlap the conductor sections 813, 814, 815A, 815B and 816 shown in FIG. 20C, respectively, when viewed in the direction perpendicular to the first surface 21a of the substrate 21, i.e., the direction perpendicular to the second surface of the dielectric layer 81.

The LC composite component 1 includes conductor sections 83V1, 83V2, 83V3, 83V4 and 83V5 penetrating the dielectric layers 82 and 83, and conductor sections 82V7, 82V8, 82V9, 82V10 and 82V11 penetrating the dielectric layer 82. The conductor sections 83V1 to 83V5 are hatched in FIG. 21A. In FIG. 21A the conductor sections 82V7 to 82V11 are shown in chain double-dashed lines. Respective one ends of the conductor sections 83V1 to 83V4 and 83V5 are connected to the conductor sections 81T1 to 81T4 and 818 shown in FIG. 20C, respectively. Respective one ends of the conductor sections 82V7, 82V8, 82V9, 82V10 and 82V11 are connected to the conductor sections 813, 814, 815A, 815B and 816 shown in FIG. 20C, respectively. The respective other ends of the conductor sections 82V7, 82V8, 82V9, 82V10 and 82V11 are connected to the conductor sections 823, 824, 825A, 825B and 826, respectively.

Figure 21B:
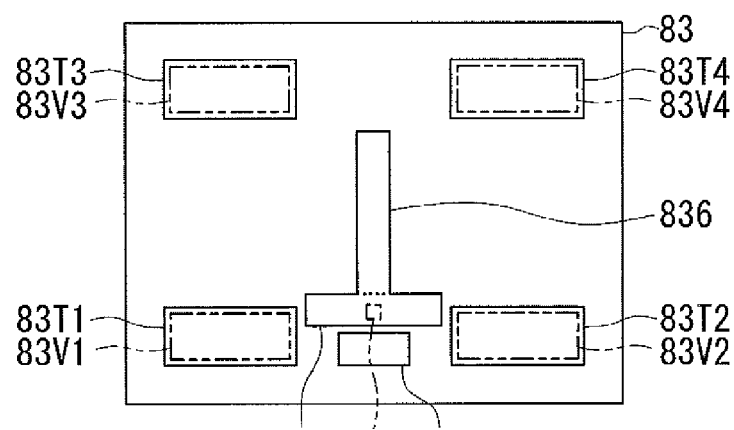

FIG. 21B shows the second surface of the dielectric layer 83. Capacitor-forming conductor sections 833, 835 and 836 and terminal-forming conductor sections 83T1, 83T2, 83T3 and 83T4 are formed on the second surface of the dielectric layer 83. FIG. 21B illustrates the above-listed conductor sections as viewed from the first-surface side of the dielectric layer 83. The layout of the conductor sections 833, 835, 836 and 83T1 to 83T4 in FIG. 21B is the same as the layout of the conductor sections 513, 515, 516 and 51T1 to 51T4 in FIG. 12A described in the second embodiment section.

The conductor sections 823 and 824 shown in FIG. 21A are opposed to the conductor section 833 with the dielectric layer 83 interposed between the conductor section 833 and the conductor sections 823, 824. The capacitor 13 of the fourth embodiment is constituted by the conductor sections 823 and 833 and a portion of the dielectric layer 83 that lies therebetween. The capacitor 14 of the fourth embodiment is constituted by the conductor sections 824 and 833 and a portion of the dielectric layer 83 that lies therebetween. The conductor sections 825A and 825B shown in FIG. 21A are opposed to the conductor section 835 with the dielectric layer 83 interposed between the conductor section 835 and the conductor sections 825A, 825B. The capacitor 15 of the fourth embodiment is constituted by the conductor sections 825A, 825B and 835 and a portion of the dielectric layer 83 that lies between the conductor section 835 and the conductor sections 825A, 825B. The conductor section 826 shown in FIG. 21A is opposed to the conductor section 836 with the dielectric layer 83 interposed therebetween. The capacitor 16 of the fourth embodiment is constituted by the conductor sections 826 and 836 and a portion of the dielectric layer 83 that lies therebetween.

The conductor sections 833 and 83T1 to 83T4 are disposed to overlap the conductor sections 818 and 81T1 to 81T4 shown in FIG. 20C, respectively, when viewed in the direction perpendicular to the first surface 21a of the substrate 21, i.e., the direction perpendicular to the first surface of the dielectric layer 83. In FIG. 21B the conductor sections 83V1 to 83V5 are shown in chain double-dashed lines. The respective other ends of the conductor sections 83V1 to 83V4 and 83V5 are connected to the conductor sections 83T1 to 83T4 and 835, respectively.

Figure 21C:
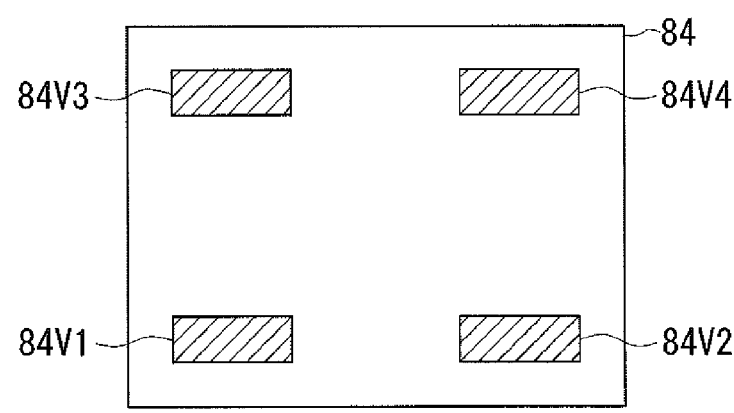

FIG. 21C shows the dielectric layer 84 and elements penetrating the dielectric layer 84. The LC composite component 1 includes terminal-forming conductor sections 84V1, 84V2, 84V3 and 84V4 penetrating the dielectric layer 84. The conductor sections 84V1 to 84V4 are hatched in FIG. 21C. Respective one ends of the conductor sections 84V1 to 84V4 are connected to the conductor sections 83T1 to 83T4 shown in FIG. 21B, respectively. The input terminal 2 of the fourth embodiment is constituted by the other end of the conductor section 84V1. The output terminal 3 of the fourth embodiment is constituted by the other end of the conductor section 84V2. The other end of each of the conductor sections 84V3 and 84V4 constitutes a ground terminal connected to the ground.

The inductor 11 of the fourth embodiment is constituted by the inductor-forming conductor sections 711, 721, 731 and 741 and the conductor sections 71V5, 72V5 and 73V5. As shown in FIG. 18, the core section 23 of the fourth embodiment lies inside the inner peripheries of the conductor sections 711, 721, 731 and 741. Each of the conductor sections 711, 721, 731 and 741 is a line-shaped conductor section extending along the periphery of the core section 23.

The inductor 12 of the fourth embodiment is constituted by the inductor-forming conductor sections 712, 722, 732 and 742 and the conductor sections 71V6, 72V6 and 73V6. As shown in FIG. 18, the core section 24 of the fourth embodiment lies inside the inner peripheries of the conductor sections 712, 722, 732 and 742. Each of the conductor sections 712, 722, 732 and 742 is a line-shaped conductor section extending along the periphery of the core section 24.

The inductor 17 of the fourth embodiment is constituted by the inductor-forming conductor sections 717A, 717B, 727 and 737 and the conductor sections 71V7, 71V8 and 72V7.

The remainder of configuration, operation and effects of the fourth embodiment are similar to those of the first or second embodiment.

The present invention is not limited to the foregoing embodiments, and various modifications may be made thereto. For example, the LC composite component of the present invention is applicable not only to low-pass filters but also to any electronic components that include inductors and capacitors.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. An LC composite component comprising:
   one or more inductors;
   one or more capacitors;
   a magnetic layer having magnetism; and
   a substrate for supporting the one or more inductors, the one or more capacitors and the magnetic layer, wherein
   the substrate has a first surface, and a second surface opposite to the first surface,
   the magnetic layer is disposed to face the first surface of the substrate,
   the one or more inductors are disposed between the first surface of the substrate and the magnetic layer,
   no magnetic layer is present between the first surface of the substrate and the one or more inductors,
   the substrate has a thickness greater than that of the magnetic layer in a direction perpendicular to the first surface of the substrate, and
   the substrate has a complex permeability having a real part and an imaginary part that are respectively smaller than a real part and an imaginary part of a complex permeability of the magnetic layer.

2. The LC composite component according to claim 1, wherein the thickness of the substrate falls within a range of 1.1 to 3 times that of the magnetic layer.

3. The LC composite component according to claim 1, wherein the one or more capacitors are disposed between the first surface of the substrate and the magnetic layer such that the one or more capacitors do not overlap the one or more inductors when viewed in the direction perpendicular to the first surface of the substrate.

4. The LC composite component according to claim 1, wherein the one or more capacitors are disposed on a side of the substrate opposite from the one or more inductors.

5. An LC composite component comprising:
   one or more inductors;
   one or more capacitors;
   a magnetic layer having magnetism; and
   a substrate for supporting the one or more inductors, the one or more capacitors and the magnetic layer, wherein
   the substrate has a first surface, and a second surface opposite to the first surface,
   the magnetic layer is disposed to face the first surface of the substrate,
   the one or more inductors are disposed between the first surface of the substrate and the magnetic layer,
   the substrate has a thickness greater than that of the magnetic layer in a direction perpendicular to the first surface of the substrate, and
   the substrate has a complex permeability having a real part and an imaginary part that are respectively smaller than a real part and an imaginary part of a complex permeability of the magnetic layer,
   the LC composite component further comprising one or more core sections having magnetism, the one or more core sections being disposed between the first surface of the substrate and the magnetic layer and connected to the magnetic layer, wherein the one or more inductors include one or more line-shaped conductor sections extending along a periphery or peripheries of the one or more core sections.

* * * * *

UNITED STATES PATENT AND TRADEMARK OFFICE
CERTIFICATE OF CORRECTION

PATENT NO. : 9,647,626 B2  
APPLICATION NO. : 14/700718  
DATED : May 9, 2017  
INVENTOR(S) : Shinichiro Toda et al.

Page 1 of 1

It is certified that error appears in the above-identified patent and that said Letters Patent is hereby corrected as shown below:

In the Specification

Column 12, Line 52, change "[Hm]" to --[H/m]--.

Column 25, Line 57, change "7411" to --74T1--.

Column 26, Line 4, change "8112" to --81T2--.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*